(12) United States Patent
Yokoyama et al.

(10) Patent No.: US 11,264,087 B2
(45) Date of Patent: Mar. 1, 2022

(54) SEMICONDUCTOR DEVICE AND METHOD OF DRIVING SEMICONDUCTOR DEVICE

(71) Applicant: RENESAS ELECTRONICS CORPORATION, Tokyo (JP)

(72) Inventors: Yoshisato Yokoyama, Tokyo (JP); Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 8 days.

(21) Appl. No.: 16/845,929

(22) Filed: Apr. 10, 2020

(65) Prior Publication Data
US 2020/0342936 A1 Oct. 29, 2020

(30) Foreign Application Priority Data

Apr. 26, 2019 (JP) .............................. JP2019-085826

(51) Int. Cl.
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC ....................... G11C 11/418419; G11C 11/413
USPC ........................................................ 365/154
See application file for complete search history.

(56) References Cited

U.S. PATENT DOCUMENTS

| | | | |
|---|---|---|---|
| 9,299,395 B2* | 3/2016 | Kulkarni | G11C 11/419 |
| 9,583,180 B2* | 2/2017 | Holst | G11C 11/418 |
| 9,997,236 B1* | 6/2018 | Pathak | G11C 7/04 |
| 2007/0008781 A1* | 1/2007 | Jono | G11C 16/10 365/185.23 |
| 2007/0030741 A1* | 2/2007 | Nii | G11C 5/06 365/189.11 |
| 2011/0141825 A1* | 6/2011 | Hatanaka | G11C 29/028 365/189.07 |
| 2015/0023086 A1* | 1/2015 | Wendell | G11C 11/412 365/72 |
| 2015/0162058 A1* | 6/2015 | Joshi | G11C 7/12 365/189.11 |
| 2016/0247559 A1* | 8/2016 | Atallah | H01L 27/1104 |

(Continued)

FOREIGN PATENT DOCUMENTS

| | | |
|---|---|---|
| JP | 2009-252256 A | 10/2009 |
| JP | 2017-054570 A | 3/2017 |

*Primary Examiner* — Sung Il Cho
*Assistant Examiner* — Sung I Cho
(74) *Attorney, Agent, or Firm* — McDermott Will & Emery LLP

(57) ABSTRACT

A semiconductor device includes a first wiring having a first portion, a second portion, a third portion provided between the first portion and the second portion, memory cells connected to the third portion of the first wiring, a field effect transistor having a drain connected to the second portion, and a gate, and a second wiring provided in parallel with the first wiring. The third portion of the first wiring includes a fourth portion located nearest to the first portion and a fifth portion located nearest to the second portion. The first wiring further includes a sixth portion disposed between the first portion and the fourth portion. The memory cells include a first memory cell connected to the fourth portion and a second memory cell connected to the fifth portion. The second wiring is electrically connected between the sixth portion and the gate of the field effect transistor.

11 Claims, 29 Drawing Sheets

(56) References Cited

U.S. PATENT DOCUMENTS

2017/0316820 A1* 11/2017 Kumar .................. G11C 5/147
2019/0221256 A1* 7/2019 Kumar .................. G11C 11/418

* cited by examiner

SEMICONDUCTOR DEVICE AND METHOD OF DRIVING SEMICONDUCTOR DEVICE

CROSS-REFERENCE TO RELATED APPLICATIONS

The disclosure of Japanese Patent Application No. 2019-085826 filed on Apr. 26, 2019 including the specification, drawings and abstract is incorporated herein by reference in its entirety.

BACKGROUND

The present disclosure can be applied to a semiconductor device having a high parasitic resistivity metal wiring or a high load capacity of metal wiring with respect to a semiconductor device.

There are disclosed techniques listed below.

[Patent Document 1] Japanese Unexamined Patent Application Publication No. 2017-54570

[Patent Document 2] Japanese Unexamined Patent Application Publication No. 2009-252256

In a semiconductor device manufactured using state-of-the-art manufacturing processes, a parasitic resistivity of the metal wiring tends to be high. For example, in order to avoid slowing a rising or falling speed of a word line voltage at a position far from the word line driver due to an effect of a resistive components of the word line, a semiconductor device has been proposed in which an assist driver is provided at the other end of a word line to which a word line driver is not connected (For example, refer to the semiconductor device proposed in a Japanese Unexamined Patent Application Publication No. 2017-54570).

Further, in a miniaturized SRAM (static random access memory), in a memory cell where a static noise margin (hereinafter referred to as an SNM) is insufficient, in order to enlarge the SNM, a semiconductor memory having a circuit for lowering a potential of the word line has been proposed (For example, refer to a Japanese Unexamined Patent Application Publication No. 2009-252256).

SUMMARY

In the Japanese Unexamined Patent Application Publication No. 2017-54570, an assist driver connects or disconnects the other end of the word line to a power supply (Vdd) in accordance with a voltage of the other end of the word line to which a memory cell is connected. The higher a parasitic resistivity of the word line, the slower a signal voltage reaches the assist driver. Therefore, an effect for increasing speed may not be enough. Further, when a memory cell lacking SNM is connected to a word line having a higher parasitic resistivity, if the other end of the word line is connected to the power supply (Vdd) by an assist driver, the operation of the memory cell may become unstable.

It is an object of the present disclosure to provide a technique capable of increasing the rising speed or the falling speed of a wiring voltage at a position distant from a driver in a wiring where a wiring or a load capacity having a high parasitic resistance is large.

Other objects and novel features will become apparent from the description of this specification and the accompanying drawings.

An outline of representative ones of the present disclosure will be briefly described below.

A semiconductor device according to an embodiment includes: a first wiring having a first portion, a second portion different from the first portion, and a third portion different from the first portion and the second portion and provided between the first portion and the second portion; a plurality of memory cells connected to the third portion of the first wiring; a field effect transistor having a drain connected to the second portion and a gate; and a second wiring provided in parallel with the first wiring. The third portion of the first wiring includes a fourth portion located nearest to the first portion and a fifth portion located nearest to the second portion. The first wiring further includes a sixth portion different from the first portion and the fourth portion and disposed between the first portion and the fourth portion. The plurality of memory cells include a first memory cell connected to the fourth portion and a second memory cell connected to the fifth portion. The second wiring is electrically connected between the sixth portion and the gate of the field effect transistor.

According to the above semiconductor device, the rising speed or the falling speed of the voltage of the wiring at a position distant from the driver circuit can be increased.

DETAILED DESCRIPTION

Figure 1:
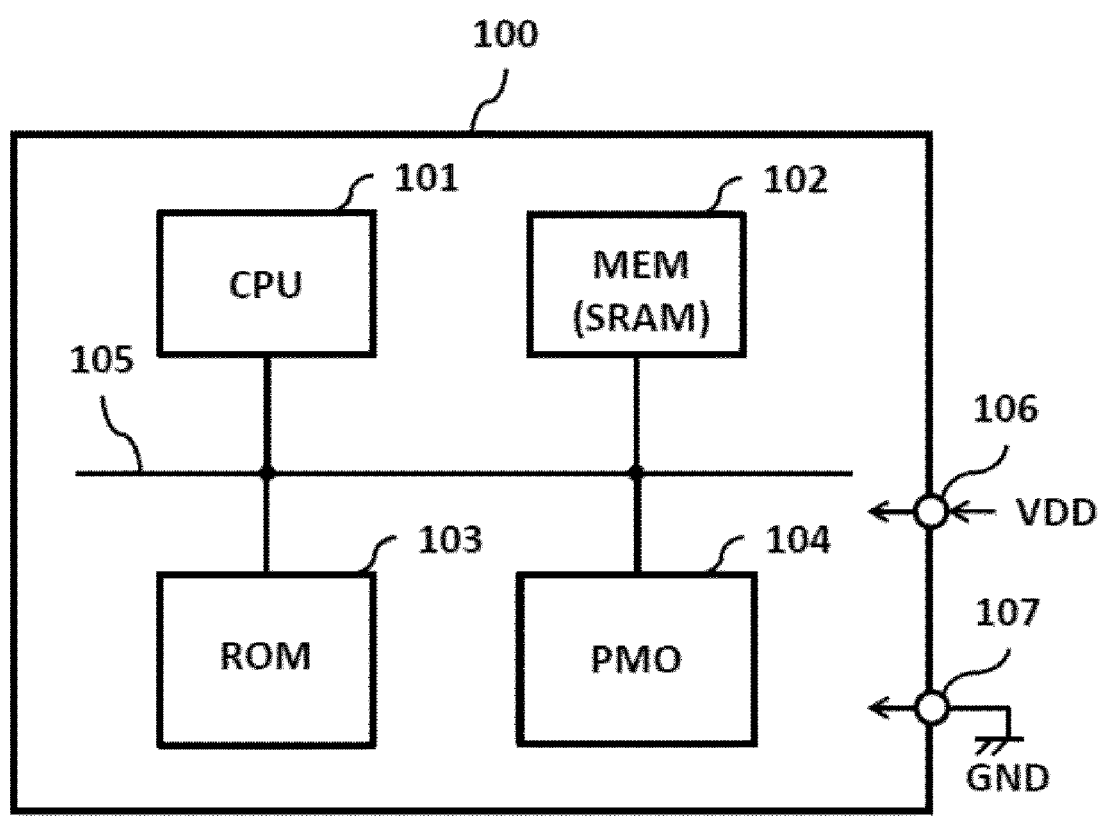
FIG. 1 is a diagram illustrating an exemplary configuration of a semiconductor device according to a first embodiment.

Hereinafter, the embodiments and the modified examples will be described with reference to the drawings. However, in the following description, the same components are denoted by the same reference numerals, and a repetitive description thereof may be omitted. It should be noted that the drawings may be represented schematically in comparison with actual embodiments for the sake of clarity of explanation, but are merely an example and do not limit the interpretation of the present invention.

(Configuration Example of a Semiconductor Device)

FIG. 1 is a diagram showing a configuration example of a semiconductor device according to a first embodiment. The semiconductor device 100 is formed on a single semiconductor chip such as monocrystalline silicon using a known manufacturing method of a CMOS transistor. The semiconductor device 100 constitutes a microcontroller (MCU), and includes a central processing unit (CPU) 101, a volatile memory device (MEM) 102 such as a static random access memory (SRAM), and an electrically rewritable nonvolatile memory (ROM) 103 such as a flash memory. The semiconductor device 100 further includes a peripheral circuit (PMO) 104 including a plurality of functional modules having desired functions such as a data-transfer device and a communication circuit. The circuits (101, 102, 103, and 104) in the semiconductor device 100 are interconnected by a bus 105. The semiconductor device 100 includes an external terminal 106 to which a power supply potential VDD as a first reference potential is supplied, an external terminal 107 to which a ground potential GND as a second reference potential that differs from the first reference potential is supplied, and a plurality of external terminals (not shown) used for inputting and outputting a signal. The power supply potential VDD and the ground potential GND are supplied to the circuits (101, 102, 103, and 104) in the semiconductor device 100.

(Configuration Example of Memory Device 102)

Figure 2:
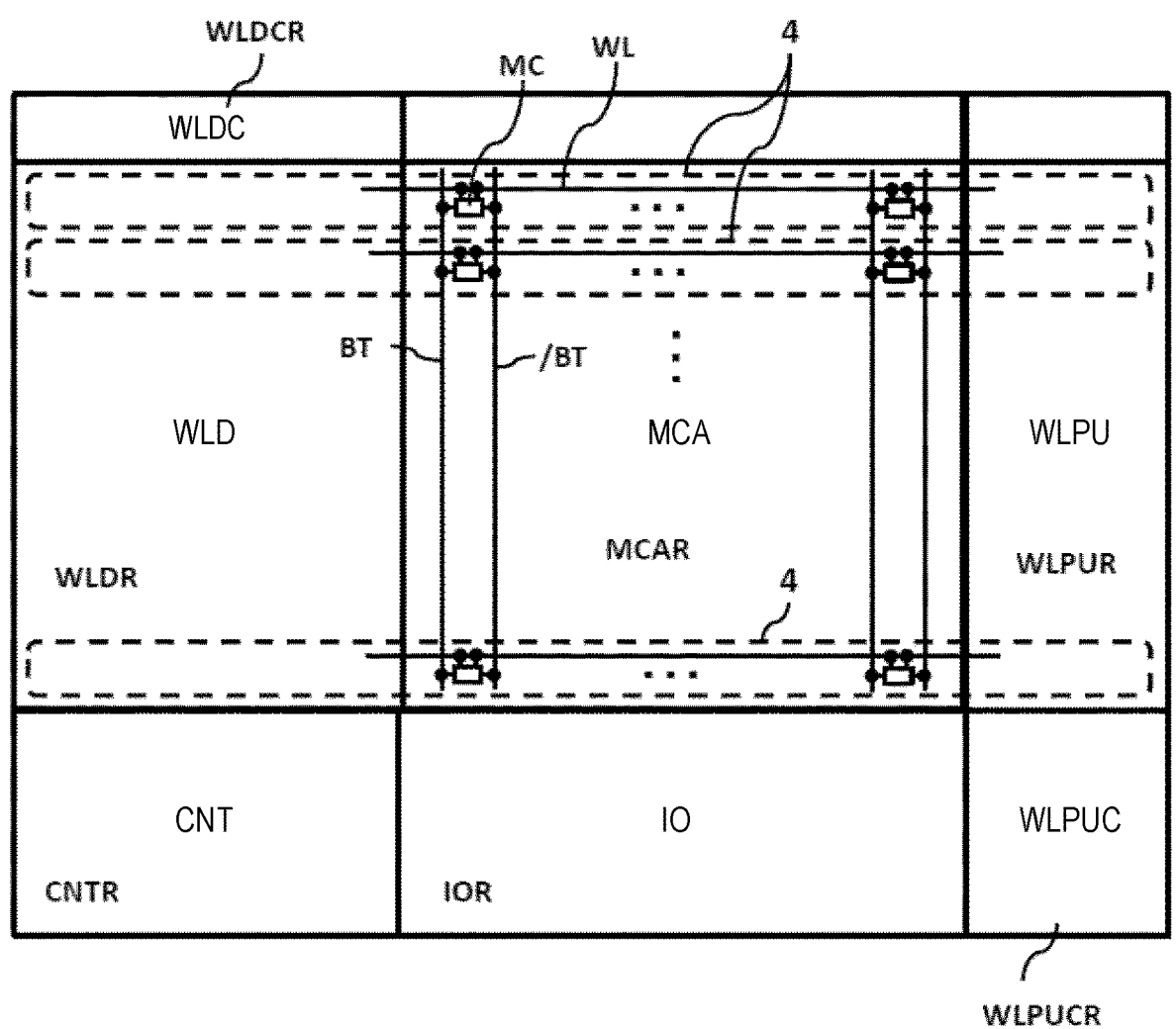
FIG. 2 is a diagram showing an exemplary configuration of a memory device of FIG. 1.

FIG. 2 is a diagram showing a configuration example of a memory device 102 of FIG. 1 The memory device 102 includes a memory cell array region MCAR in which a memory cell array MCA including a plurality of memory cells MC, a plurality of word lines WL, and a plurality of pairs of complementary bit lines BT, /BT are formed, a word line driver circuit forming region WLDR in which a plurality of word line driver circuits WLD are formed, and an word line pull up circuit forming region WLPUR in which a plurality of word line pull up circuit WLPU are formed. A plurality of memory cells MC are arranged in a matrix within the memory cell array MCAs. A word line WL and a pair of complementary bit line BT, /BT are connected to each of a plurality of memory cells MC.

The memory device 102 further includes a control unit formation area CNTR in which a control unit CNT for controlling the operation of the memory device 102 is formed, and an input/output unit formation region IOR in which an input/output unit IC such as a read circuit and a write circuit is formed. The memory device 102 further includes a word line pull up control circuit forming region WLPUCR in which a word line pull up control circuit WLPUC for controlling the word line pull up circuit WLPU is formed, and a word line driver control circuit formation region WLDCR in which a word line driver control circuit WLDC for controlling the word line driver circuit WLD is formed.

In FIG. 2, a unit circuit 4 corresponding to one row (hereinafter, simply referred to as a unit circuit) is indicated by a dotted line of a square. A plurality of the unit circuits 4 are arranged vertically side by side in the region WLDR, MCAR, WLPUR in plan view.

(Configuration Example of the Unit Circuit 4)

Figure 3:
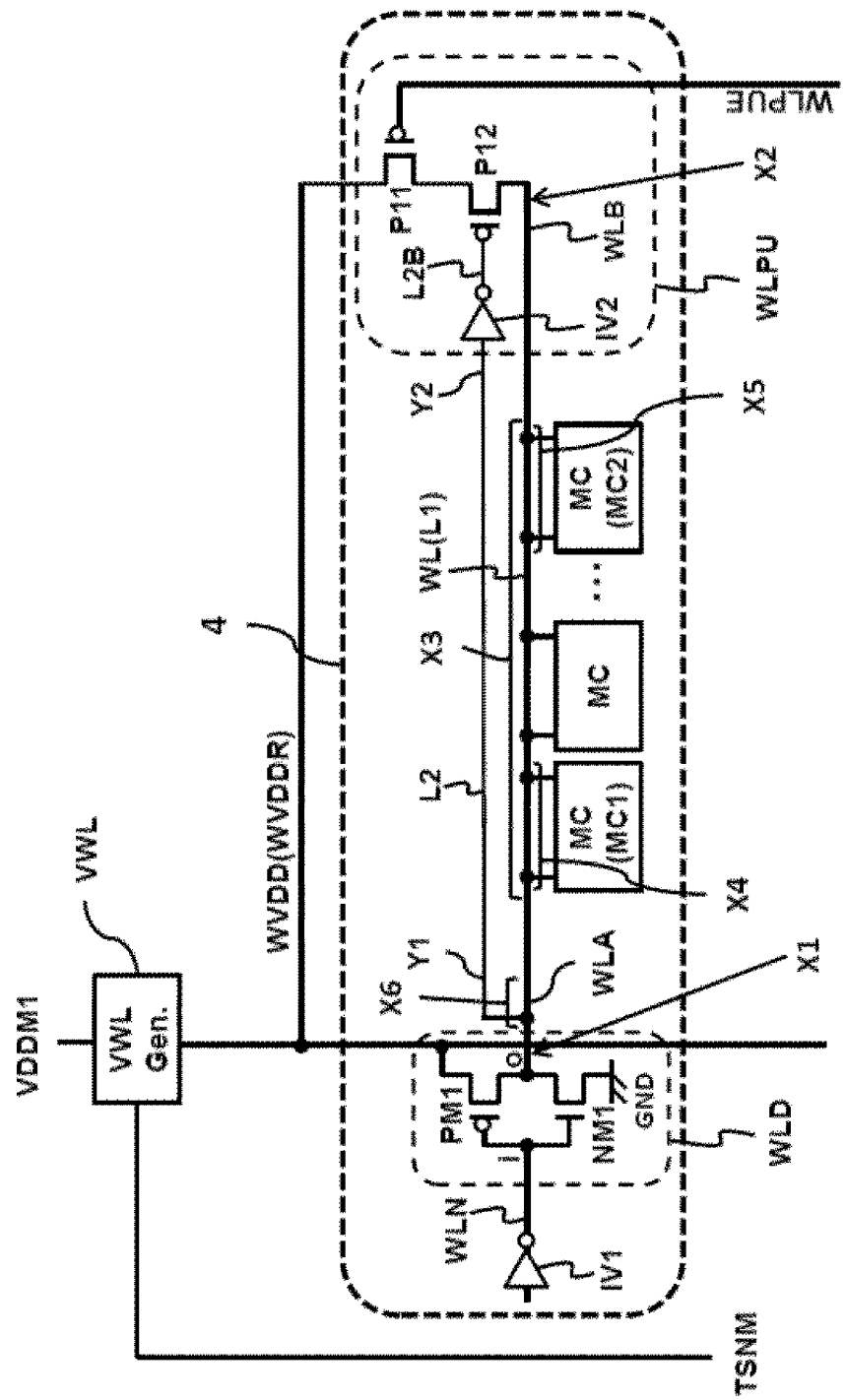
FIG. 3 is a diagram illustrating an exemplary configuration of a unit circuit of FIG. 2.
Figure 4:
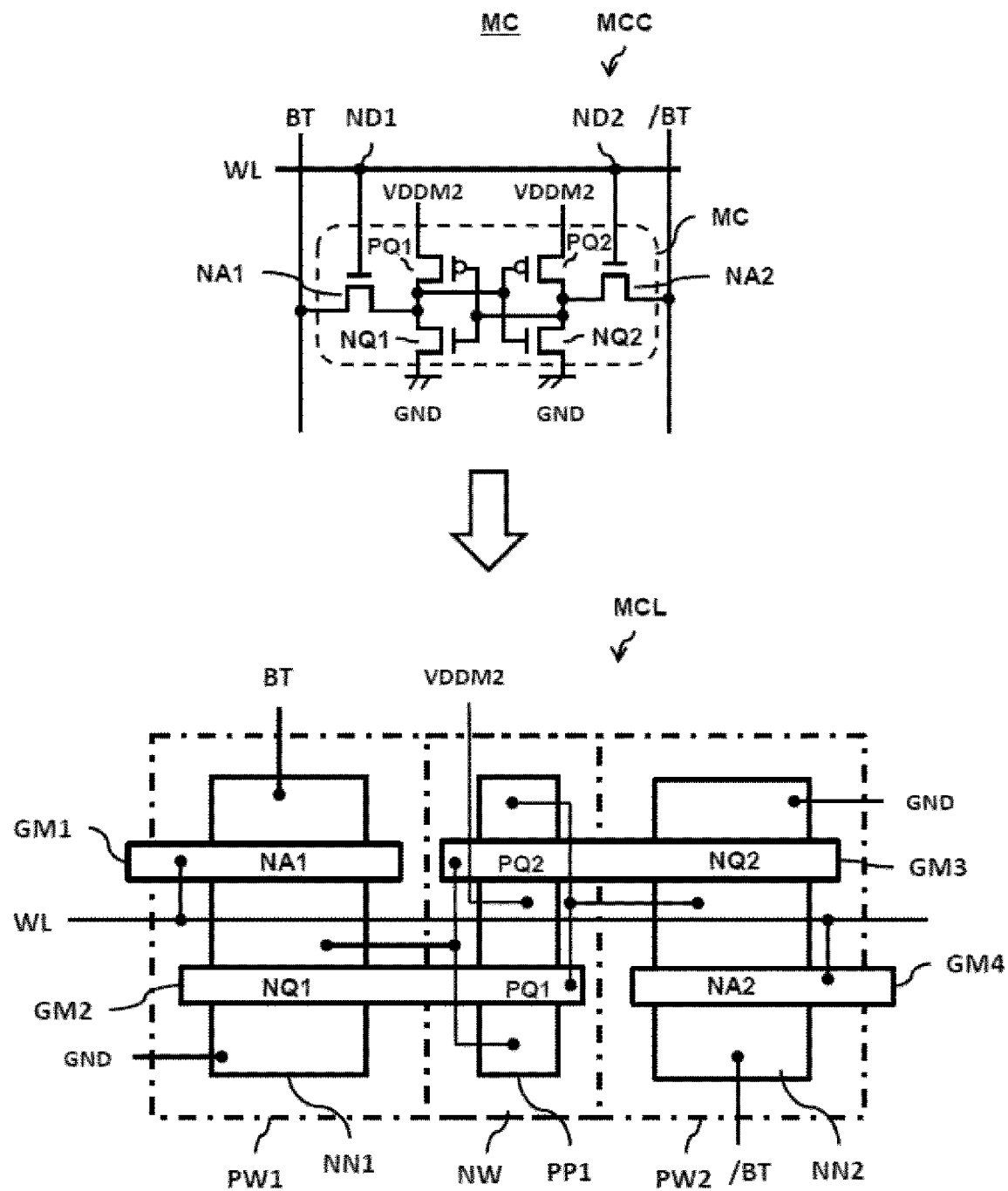
FIG. 4 is a diagram showing an exemplary configuration of a memory cell of FIG. 3.

FIG. 3 is a diagram illustrating a configuration example of the unit circuit 4 of FIG. 2. FIG. 4 is a diagram showing an exemplary configuration of the memory cell of FIG. 3. As shown in FIG. 3, the unit circuit 4 includes one word line driver circuit (driving circuit) WLD, one word line WL connected to the word line driver circuit WLD, a plurality of memory cells MC connected to the word line WL, one word line pull up circuit WLPU connected to the word line WL, a wiring L2 provided in parallel to the word line WL, and the like. If word line WL is the first wiring L1, then wiring L2 can be considered the second wiring. For the sake of simplicity, a plurality of pairs of complementary bit line BT, /BT connected to each of the plurality of memory cells MC are not illustrated in the unit circuit 4.

A circuit configuration MCC of each of the plurality of memory cells MC includes, in one instance, two access transistors NA1, NA2, two load transistors PQ1, PQ2, and two drive transistors NQ1, NQ2, as shown in FIG. 4. Each of access transistors NA1, NA2, drive transistors NQ1, and NQ2 is N-channel MOS field effect transistor, and load transistors PQ1 and PQ2 are P-channel MOS field effect transistor.

The source-drain path of the load transistor PQ 1 and the source-drain path of the drive transistor NQ1 are connected in series between the memory cell power supply potential VDDM2 and the ground potential GND. The source-drain path of the load transistor PQ 2 and the source-drain path of the drive transistor NQ2 are connected in series between the second memory power supply potential (memory array power supply potential) VDDM2 and the ground potential GND.

The gate of the load transistor PQ1 and the gate of the drive transistor NQ1 are connected to constitute a common gate, the drain of the load transistor PQ2 and the drain of the drive transistor NQ2 are connected to constitute a common drain, and the common gate of the load transistor PQ1 and the drive transistor NQ1 are connected to the common drain of the load transistor PQ2 and the drive transistor NQ2.

Similarly, the gate of the load transistor PQ2 and the gate of the drive transistor NQ2 are connected to constitute a common gate, the drain of the load transistor PQ1 and the drain of the drive transistor NQ1 are connected to constitute a common drain, and the common gate of the load transistor PQ2 and the drive transistor NQ2 are connected to the common drain of the load transistor PQ1 and the drive transistor NQ1.

The source-drain path of the access transistor NA1 is connected between the bit line BT of the complementary pair of bit lines BT, /BT, the load transistor PQ1 and the common drain of the drive transistor NQ1. The gate of the access transistor NA1 is connected to the word line WL by a connecting node ND1. The source-drain path of the access transistor NA2 is connected between the bit line/BT of the complementary pair of bit lines BT, /BT, the load transistor PQ2 and the common drain of the drive transistor NQ2. The gate of the access transistor NA2 is connected to the word line WL by a connecting node ND2.

Each layout configuration MCL of the plurality of memory cells MC includes P-type well PW1 and PW2 formed in the semiconductor chip, a N-type well NW disposed between P-type well PW1 and PW2, and four gate electrode GM1 to GM4 formed by polycrystalline.

Gate electrode GM1, GM2 and N-type impurity introduction layer NN1 are formed in P-type well PW1. In the region of the P-type well PW1, the gate electrode GM1 constitutes the gate of the access transistor NA1 connected to the word line WL, and the gate electrode GM2 constitutes the gate of the drive transistor NQ1. The N-type impurity introduction layer NN1 constituting the source or drain of the access transistor NA1 is connected to the bit line BT. The N-type impurity introduction layer NN1 constituting the source of the drive transistor NQ 1 is connected to the wiring supplied with the ground potential GND. The N-type impurity introduction layer NN1 provided between the gate electrode GM 1 and the gate electrode GM2 constitutes the drain or source of the drain or access transistor NA1 of the drive transistor NQ1.

Gate electrode GM2, GM3 and P-type impurity introduction layer PP1 are formed in the N-type well NW. In the region of the N-type well NW, the gate electrode GM2 constitutes the gate of the load transistor PQ1, and the gate electrode GM3 constitutes the gate of the load transistor PQ2. The P-type impurity introduction layer PP1 provided between the gate electrode GM 2 and the gate electrode GM3 constitutes a source of the load transistors PQ1 and PQ2, and is connected to the wiring to which the second memory power supply potential VDDM2 is supplied. The P-type impurity introduction layer PP1 constituting the drain of the load transistor PQ 1 is connected to the gate electrode GM3 and the N-type impurity introduction layer NN1 constituting the drain of the drive transistor NQ1 by using, for example, the metal wiring of the first layer or the like.

Gate electrode GM3, GM4 and N-type impurity introduction layer NN2 are formed in P-type well PW2. In the region of the P-type well PW 2, the gate electrode GM4 constitutes the gate of the access transistor NA2 connected to the word line WL, and the gate electrode GM3 constitutes the gate of the drive transistor NQ2. The N-type impurity introduction layer NN2 constituting the source or drain of the access transistor NA2 is connected to the bit line/BT. The N-type impurity introduction layer NN2 constituting the source of the drive transistor NQ 2 is connected to the wiring supplied with the ground potential GND. The N-type impurity introduction layer NN2 provided between the gate electrode GM 3 and the gate electrode GM4 constitutes the drain or source of the drain or access transistor NA2 of the drive transistor NQ2. The P-type impurity introduction layer PP1 constituting the drain of the load transistor PQ 2 is connected to the gate electrode GM2 and the N-type impurity introduction layer NN1 constituting the drain of the drive transistor NQ2 by using, for example, the metal wiring of the first layer or the like.

The word line driver circuit WLD include input terminal i, output terminal o, P-channel MOS field effect transistor PM1, and N-channel MOS field effect transistor NM1, as shown in FIG. 3. The input terminal i of the word line driver circuit WLD is connected to the outputs of the inverters IV1, which are preliminary circuit, via a wiring (third wiring) WLN. The output terminal o of the word line driver circuit WLD is connected to the word line WL. The source of the P-channel MOS field effect transistor PM1 is connected to a wiring to which the outputs of the power supply potential generating circuit (VWL Gen.) VWL generating the power supply potential of the word line driver circuit WLD are supplied. The drain of the P-channel MOS field effect transistor PM1 is connected to the output terminal o. The gate of P-channel MOS field effect transistor PM1 is connected to input terminal i. The source of the N-channel MOS field effect transistor NM1 is connected to the wiring to which the ground potential GND is supplied. The drain of the N-channel MOS field effect transistor NM1 is connected to the output terminal o. The gate of N-channel MOS field effect transistor NM1 is connected to input terminal i. The word line driver circuit WLD changes the potential of the word line WL by supplying a potential outputted by the power supply potential generating circuit VWL or the ground potential GND to the word line WL in accordance with the potential inputted to the input terminal i.

As shown in FIG. 3, the word line WL includes a first portion X1, a second portion X2 different from the first portion X1, and a third portion X3 provided between the first portion X1 and the second portion X2 and different from the first portion X1 and the second portion X2. The first portion X1 is connected to the output terminal o of the word line driver circuit WLD. The second portion X2 is connected to a drain of a P-channel MOS field effect transistor P12, which is a pull up transistor, provided in the word line pull up circuit WLPU. The third portion X3 is connected to a gate of an access transistor NA1 and NA2 in a plurality of memory cells MC of one row provided in the memory cell array MCA. Thus, the third portion X3 can also be viewed as a memory cell connection area. The gates of the plurality of access transistors can be viewed as a load capacity for the word line WL.

When looking at the word line WL from the output terminal o-side of the word line driver circuit WLD, the first portion X1 can be viewed as a proximal end WLA of the word line WL, and the second portion X2 can be viewed as a distal end WLB of the word line WL. In other words, the word line WL has a proximal end WLA closer to the output terminal o of the word line driver circuit WLD and a distal end WLB farther from the output terminal o of the word line driver circuit WLD than the proximal end WLA.

The third portion X3 of the word line WL further includes a fourth portion X4 located nearest to the first portion X1 and a fifth portion X5 located nearest to the second portion X2. The plurality of memory cells MC for one row includes a first memory cell (MC1) having access transistors NA1 and NA2 whose gates are connected to fourth portion X4, and a second memory cell (MC2) having access transistors NA1 and NA2 whose gates are connected to fifth portion X5. The word line WL further has a sixth portion X6 different from the first portion X1 and the fourth portion X4, and provided between the first portion X1 and the fourth portion X4.

As shown in FIG. 3, the second wiring L2 has a first portion Y1 connected to the sixth portion X6 and a second portion Y2 differing from the first portion Y1. The second portion Y2 is connected to the input terminal of inverter circuit IV2 in the word line pull up circuit WLPU. When the second wiring L2 is viewed from the output terminal o of the word line driver circuit WLD, the first portion Y1 can be viewed as the proximal end portion of the second wiring L2, and the second portion Y2 can be viewed as the distal end portion of the second wiring L2. The second wiring L2 may be configured by a metal wiring layer different from that of the word line WL. The second wiring L2 may also be composed of the same layer of metal wiring layer as the word line WL. Since the number of transistors connected to the second wiring L2 is small, the load of the second wiring L2 is small compared to the load of the word line WL.

The word line pull up circuit WLPU include an inverter circuit IV2 having waveform shaping circuit role and two P-channel MOS field effect transistors P11, P12, as shown in FIG. 3. The P-channel MOS field effect transistor P11 serves as a enable switch transistor for controlling the activation and deactivation of the word line pull up circuit WLPU. The P-channel MOS field effect transistor P12 serves as a pull up transistor for pulling up the potential of the second portion X2 or the distal end WLB of the word line WL. The output terminal of the inverter circuit IV2 is connected to the gate of the P-channel MOS field effect transistor P12 via the wiring (fourth wiring) L2B. The source of the P-channel MOS field effect transistor P11 is connected to a wiring to which the output of the power supply potential generating circuit VWL is supplied. The gate of the P-channel MOS field effect transistor P11 is supplied from the word line pull up control circuit WLPUC with the pull up enable signal WLPUE which controls the operation of the word line pull up circuit WLPU. The drain of the P-channel MOS field effect transistor P11 is connected to the source of the P-channel MOS field effect transistor P12. The drain of the P-channel MOS field effect transistor P12 is connected to the second portion X2 or the distal end WLB.

When the pull up enable signal WLPUE is set to an activation level such as a low level, the P-channel MOS field effect transistor P11 is turned on. In this condition, if the output signal of the word line driver circuit WLD transitions from an unselected level signal such as a low level to a selected state signal such as a high level, the first portion X1 or the proximal end WLA of the word line WL transitions from the low level to the high level, and the first portion Y1 of the second wiring L2 transitions from the low level to the high level substantially simultaneously. Since the load of the second wiring L2 is smaller than the load of the word line WL, the second portion Y2 of the second wiring L2 transitions from low level to high level prior to the second portion X2 or distal end WLB of the word line WL transitioning from low level to high level. As a result, the output signal of the inverter circuit IV2 transitions from the high level to the low level, the P-channel MOS field effect transistor P12 is turned on, and the potential of the second portion X2 or the far end portion WLB of the word line WL is pulled up based on the potential generated by the power supply potential generation circuit VWL. That is, since the pull-up operation of the second portion X2 or the distal end WLB of the word line WL can be started quickly by the word line pull up circuit WLPU, it is possible to speed up the potential transitions in the second portion X2 or the distal end WLB of the word line WL. Thus, for example, although slightly delayed from the transition of the first memory cell (MC1) connected to the fourth portion X4 of the word line WL to the selected state, the transition of the second memory cell (MC2) connected to the fifth portion X5 of the word line WL to the selected state can be speeded up, thereby speeding up the entire address access time in the read operation of the memory device 102 and the write operation.

(Configuration Example of Power Supply Potential Generating Circuit VWL)

Figure 5:
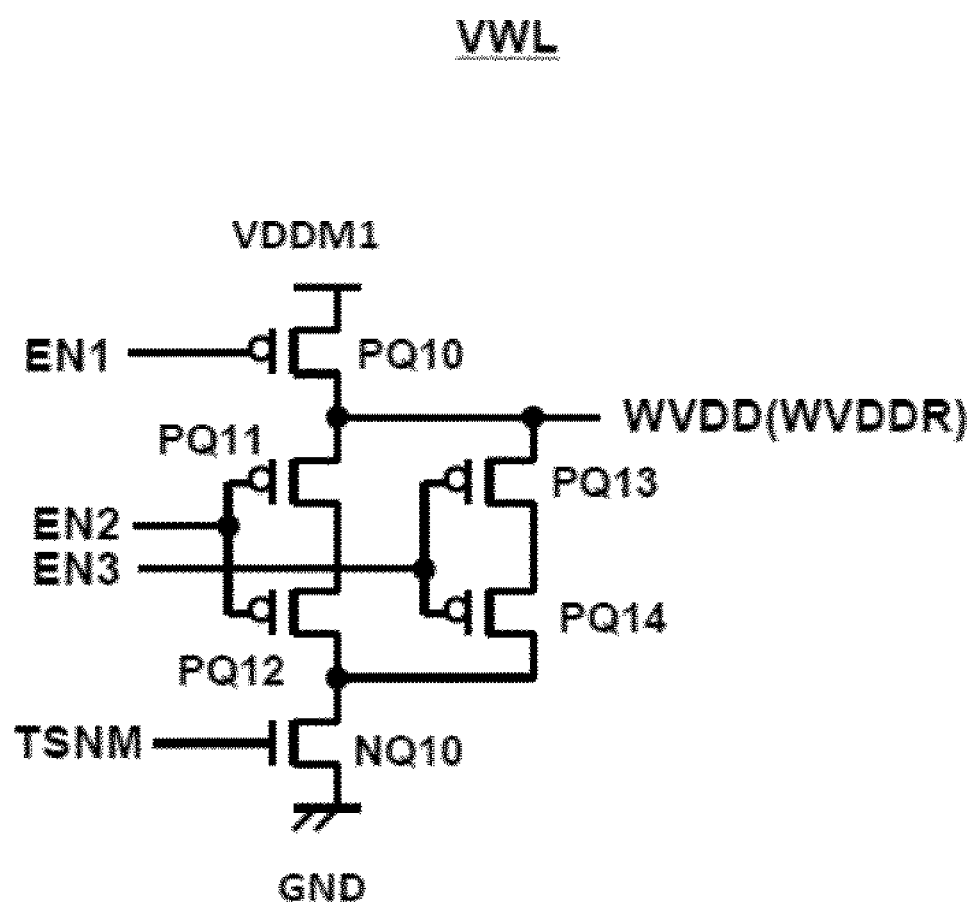
FIG. 5 is a diagram showing an exemplary configuration of a power supply potential generating circuit of FIG. 3.

FIG. 5 is a diagram showing a configuration example of a power supply potential generating circuit (VWL Gen.) VWL.

The power supply potential generating circuit VWL is a power supply potential generating circuit that generates a power supply potential of word line driver circuit WLD. The power supply potential generating circuit VWL is supplied with a first memory power supply potential VDDM1 and a ground potential GND, and is configured to receive a control signal TSNM supplied from the control unit CNT. The power supply potential generating circuit VWL is configured to receive control signal EN1, EN2, and EN3 supplied from the control unit CNT.

The power supply potential generating circuit VWL include P-channel MOS field effect transistors PQ10, PQ11, PQ12, PQ13, PQ14, and an N-channel MOS field effect transistor NQ10. The source-drain path of each of the P-channel MOS field effect transistors PQ10, PQ11, and PQ12 and the source-drain path of the N-channel MOS field effect transistor NQ10 are connected in series between the first memory power supply potential VDDM1 and the ground potential GND. The series-connected source-drain path of the P-channel MOS field effect transistors PQ13 and the PQ14 are connected in parallel with the series-connected source-drain path of the P-channel MOS field effect transistors PQ11 and PQ12. The control signal EN1 is supplied to the gate of the P-channel MOS field effect transistor PQ10, the control signal EN2 is supplied to the gates of the P-channel MOS field effect transistors PQ11 and the PQ12, and the control signal EN3 is supplied to the gates of the P-channel MOS field effect transistors PQ13 and PQ14. A control signal TSNM is provided to the gate of the N-channel MOS field effect transistor NQ10.

The ratio of a drive capacity of the P-channel MOS field effect transistor PQ 10, a drive capacity of the P-channel MOS field effect transistor PQ11 and the PQ12, and a drive capacity of the P-channel MOS field effect transistors PQ13 and the PQ14 are close to each other. The Vth characteristics of the P-channel MOS field effect transistors PQ11 and Q12, the Vth characteristics of the P-channel MOS field effect transistors PQ13 and PQ14, and the Vth characteristics of the load transistors PQ1,PQ2 of the memory cell MC are the same Vth characteristics.

When using power supply potential generating circuit VWL, control signal EN 1 has a signal level such as low level (EN1=0). The control signal EN2 and EN3 are control signal for adjusting the level of the output potential WVDD of the power supply potential generating circuit VWL, and when both the control signal EN2 and the EN3 are signal level such as low level (EN2=0 and EN3=0), the read assist function to the memory cell is invalidated. When both the control signals EN2 and the EN3 are set to a signal level other than the signal level such as low level, the potential level of the output potential WVDD of the power supply potential generating circuit VWL can be adjusted to, for example, three levels.

When the control signal TSNM is set to an activation level such as high level in synchronization with the internal clock of the memory device 102, the potential level of the output potential WVDD of the power supply potential generating circuit VWL becomes a potential (VDDM1-ΔV) obtained by stepping down a potential difference ΔV from the first memory power supply potential VDDM1. Here, the VDDM1-ΔV is a power supply potential WVDDR at the time of reading the word line driver circuit WLD of the memory device 102.

That is, the power supply potential generating circuit VWL reduces the voltage of the first memory power supply potential VDDM1 based on the activation level of the control signal TSNM at the time of read operation of the memory array MCA to generate the word line power supply potential WVDDR at the time of reading. The word line power supply potential WVDDR in the reading is used to increase the static noise margin (SNM) of the memory cell. On the other hand, when EN1=0, the power supply potential generating circuit VWL generates a word line power supply potential WVDD which is a potential level based on the control signal EN2 and the EN3 in a write operation period excluding the read operation period of the memory array MCA.

The potential relation between the first memory power supply potential VDDM1 and the second memory power supply potential VDDM2, word line driver circuit WLD and the power supply potential WVDDR at the time of reading may be VDDM1=VDDM2>WVDDR, or may be VDDM1>VDDM2>WVDDR or VDDM2>WVDDR>VDDM1. That is, if the VDDM2>WVDDR relationship can be maintained, the static noise margin (SNM) at the time of reading the memory cell MC can be enlarged.

(Example of an Operation)

Figure 6:
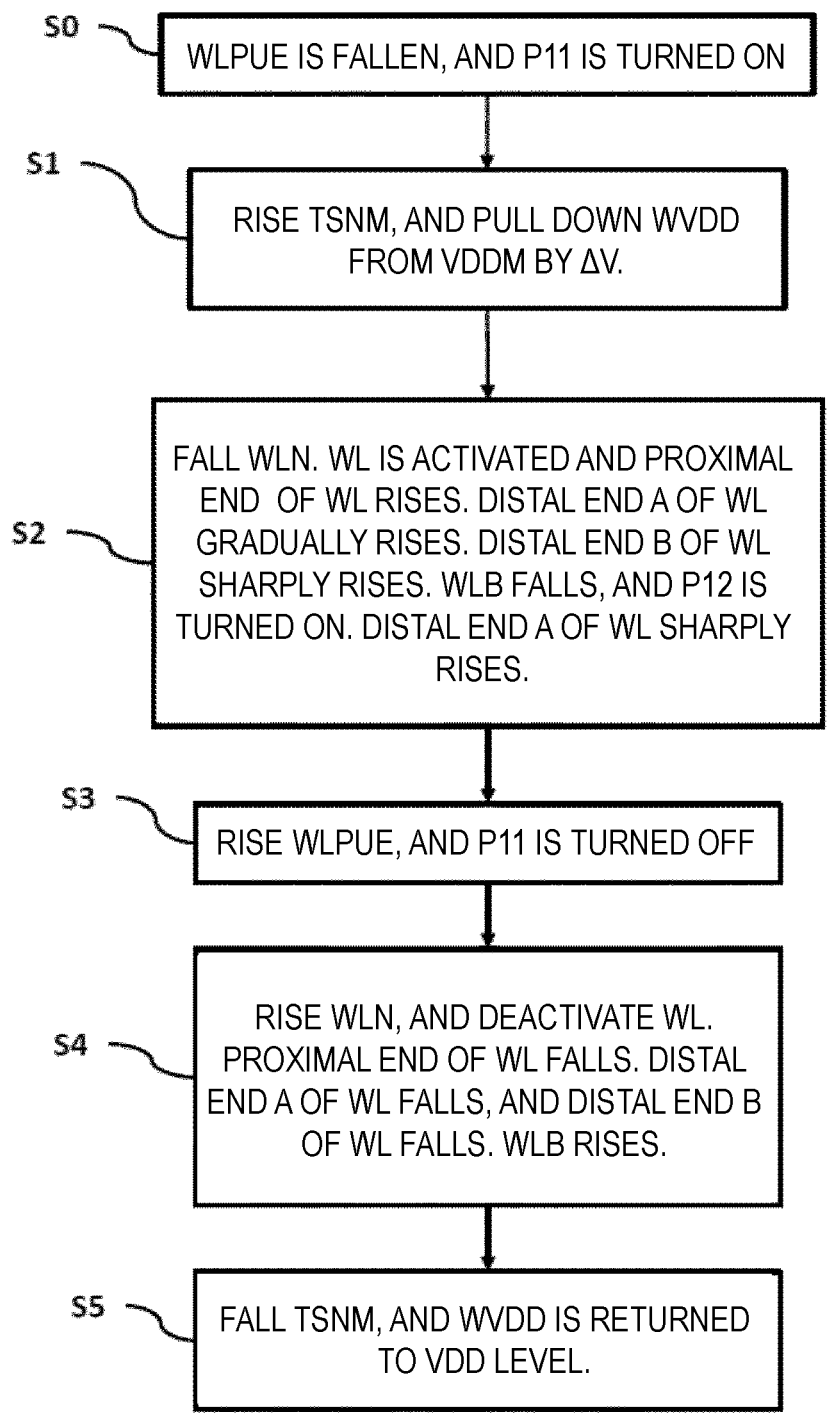
FIG. 6 is a flowchart for explaining a potential of a word line at the time of read operation of the unit circuit of FIG. 3.
Figure 7:
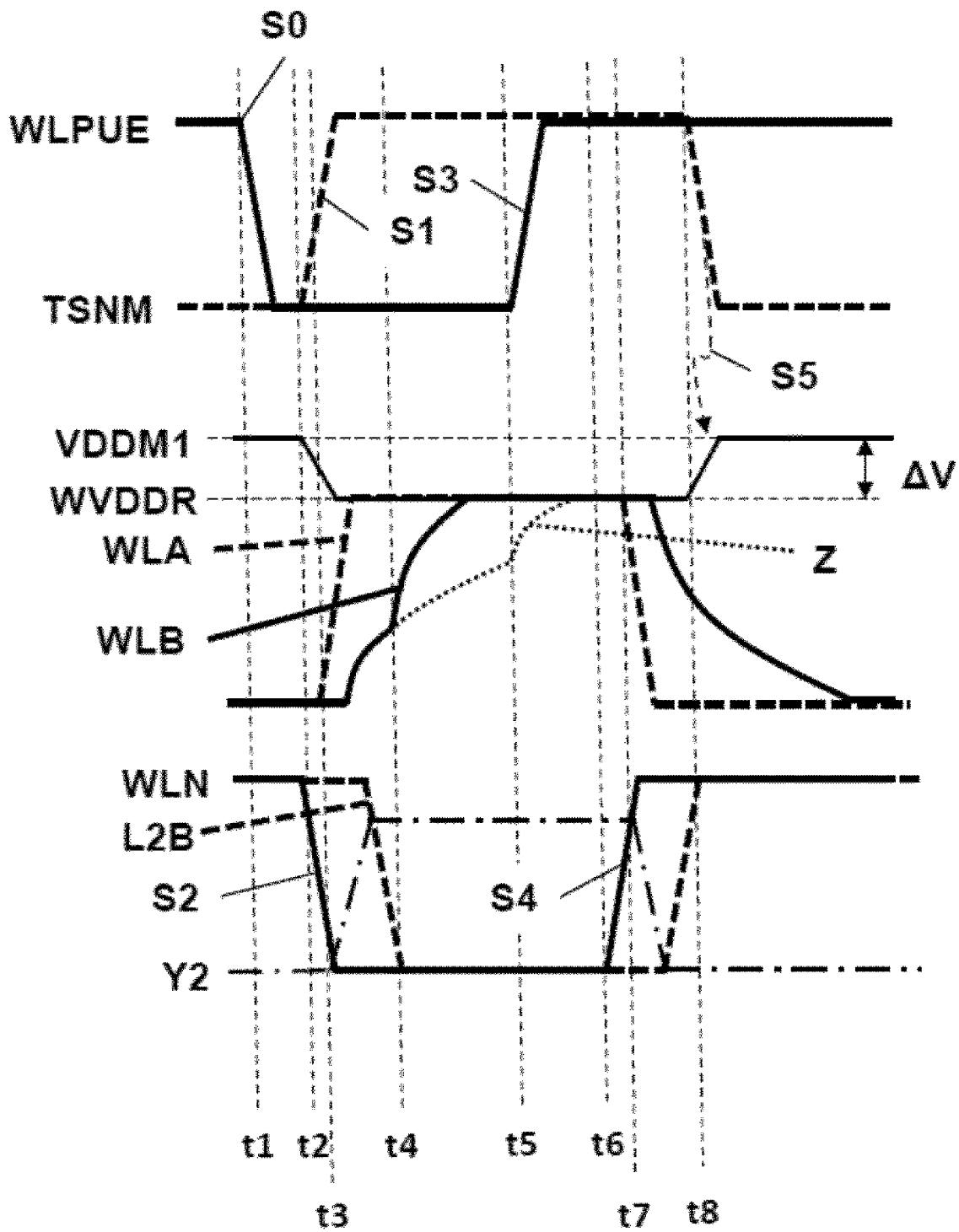
FIG. 7 is a waveform diagram illustrating a potential of the word line at the time of read operation of the unit circuit of FIG. 3.

FIG. 6 is a flowchart for explaining the potential of the word line at the time of read operation of the unit circuit of FIG. 3. FIG. 7 is a waveform diagram illustrating the potential of the word line at the time of read operation of the unit circuit of FIG. 3. In the following description, each step of FIG. 6 will be described with reference to FIG. 7.

Step S0: At time t1, the pull up enable signal WLPUE is transitioned (fallen) from an unselected level such as high level to a selection level such as low level. As a result, the P-channel MOS field effect transistor P11 is turned on (ON).

Step S1: At time t2, the control signal TSNM is transitioned (Rise) from a non activation level such as low level to an activation level such as high level. As a result, the power supply potential generating circuit VWL pulls down (steps down) the first memory power supply potential VDDM1 by the potential difference ΔV to generate the word line power supply potential WVDDR (=VDDM1-ΔV) at the time of reading.

Step S2: Also, at the time t2, the potential level of the wiring WLN connected to the output of the inverter IV1 is transitioned (fall) from an unselected level such as high level to a selection level such as low level. This causes, at time t3, the word line WL is activated and the proximal end WLA of the word line WL is transitioned from an unselected level such as low level to a selection level such as high level (Rise). Note that the potential of the selection level of the word line WL is word line power supply potential WVDDR at the time of reading.

The potential of the distal end WLB of the word line WL Rises slowly. On the other hand, since the load of the second wiring L2 is smaller than the load of the word line WL, the potential of the distal end Y2 of the second wiring L2 sharply Rise up to the word line power supply potential WVDDR at the time of reading. As a result, the potential level of the wiring L2B connected to the output terminal of the inverter circuit IV2 transitions (fall) from an unselected level such as a high level to a selected level such as a low level, and the P-channel MOS field effect transistor P12 is turned on. Therefore, at time t4, the potential of the distal end WLB of the word line WL sharply rises (Rise) and transitioned to a selection level such as high level.

In FIG. 7, a waveform indicated by a dotted line Z indicates a potential change of the distal end WLB of the word line WL when the assist driver of the Japanese Unexamined Patent Application Publication No. 2017-54570 is employed. As can be seen from FIG. 7, the transition to the selection level of the distal end WLB of the present Embodiment, as shown in solid lines, is completed at an earlier time compared to the waveform shown in the dotted line Z.

Step S3: At time t5, the pull up enable signal WLPUE is transitioned (Rise) from a selection level such as a low level to an unselected level such as a high level. As a result, the P-channel MOS field effect transistor P11 is turned off (OFF).

Step S4: At time t6, the potential level of the wiring WLN connected to the output of the inverter IV1 is transitioned (Rise) from a selection level such as a low level to an unselected level such as a high level to deactivate the word line WL. Thus, at time t7, the proximal end WLA of the word line WL transits (fall) from a selection level such as a high level to a unselected level such as a low level, and the distal end Y2 of the wiring L2 transitions (fall) from a selection level such as a high level to a unselected level such as a low level. The distal end WLB of the word line WL then transitions (fall) from a selection level such as a high level to an unselected level such as a low level. In addition, the potential level of the wiring L2B connected to the output terminal of the inverter circuit IV2 transitions (Rise) from a selection level such as a low level to a non-selection level such as a high level, and the P-channel MOS field effect transistor P12 is turned off (OFF).

Step S5: At time t8, the control signal TSNM is transit (fall) from an activation level such as a high level to a non activation level such as a low level. As a result, in the potential level of the power supply potential generated by the power supply potential generating circuit VWL, the word line power supply potential WVDDR at the time of reading is returned to the first memory power supply potential VDDM1.

Next, a planar layout and a cross-sectional view of the word line WL and the second wiring L2 in the unit circuit 4 will be described with reference to the drawings.

(Explanation of the Planar Layout and Cross-Sectional View of the Word Line WL and the Second Wiring L2)

Figure 8:
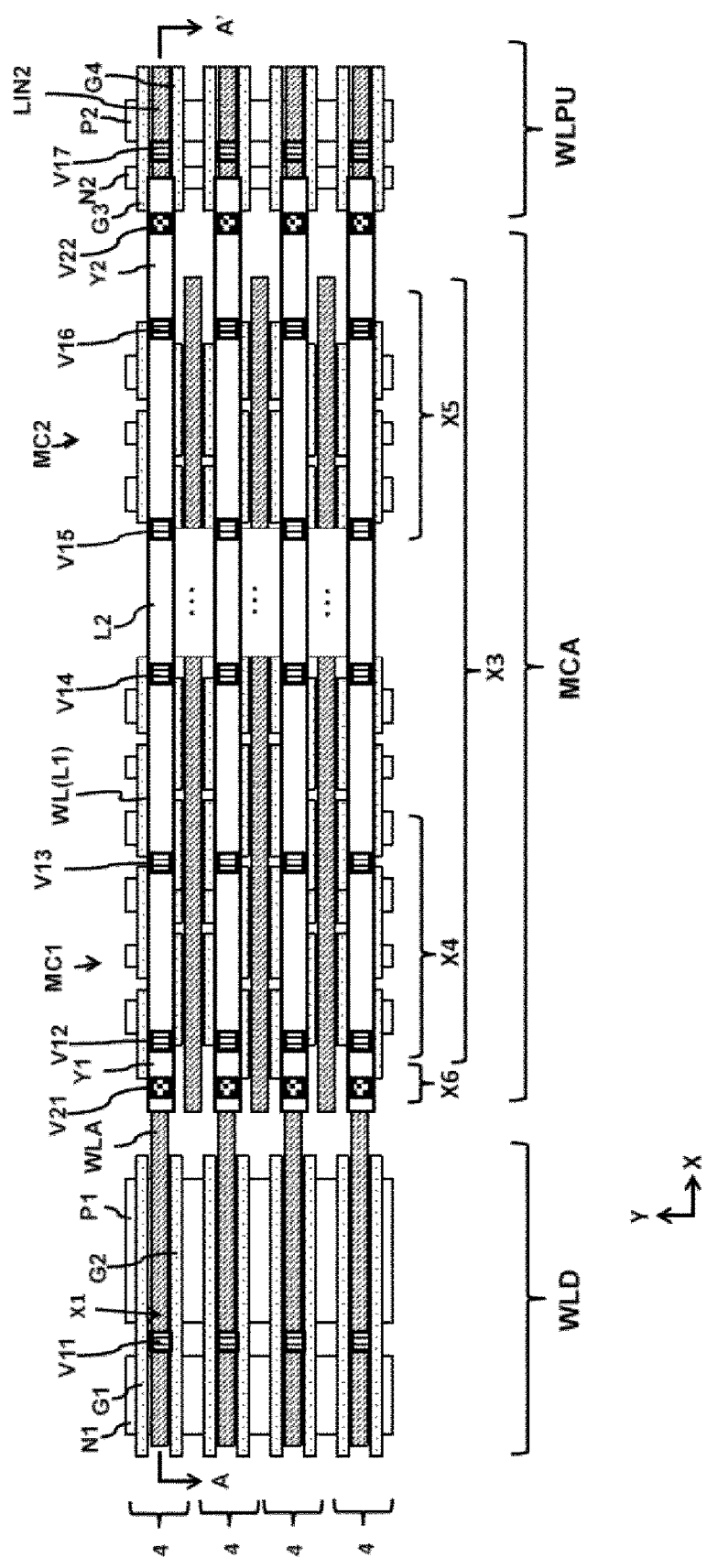
FIG. 8 is a diagram for explaining schematic planar layout of the unit circuit.
Figure 9:
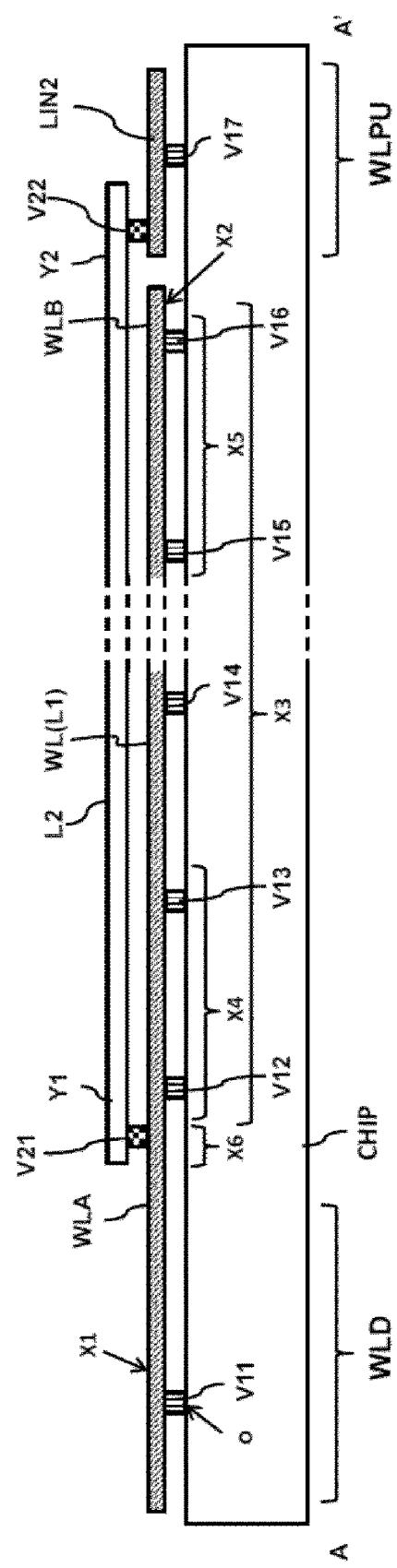
FIG. 9 shows a schematic cross-sectional view along the A-A' line of FIG. 8.

FIG. 8 is a diagram for explaining a schematic planar layout of the unit circuit 4. FIG. 9 shows a schematic cross-sectional view along the A-A' line of FIG. 8. In FIG. 8, the via electrodes V11 to V17 and the via electrodes V21 and V22 schematically show locations where the respective via electrode is formed. In FIG. 9, semiconductor chip CHIP schematically represents a semiconductor chip in which field effect transistors constituting word line driver circuit WLD, a plurality of memory cells MC, and word line pull up circuit WLPU are formed.

FIG. 8 shows a planar layout of four unit circuits 4 arranged vertically in the Y direction. Each of the four unit circuits 4 includes a word line driver circuit WLD, a memory array MCA, and a word line pull up circuit WLPU arranged in sequence in the X direction.

The word line driver circuit WLD has a first gate electrode G1 and a second gate electrode G2 composed of a polycrystalline (POLY) provided so as to extend in the X direction, an N-type impurity introduction layer (DIFF) N1 into which an N-type impurity is introduced, and a P-type impurity introduction layer (DIFF) P1 into which a P-type impurity is introduced. The first gate electrode G1 and the second gate electrode G2 constitute a gate electrode of the N-channel MOS field effect transistor NM1 and the P-channel MOS field effect transistor PM1. The N-type impurity introduction layer N 1 constitutes a source region or a drain region of the N-channel MOS field effect transistor NM1. The P-type impurity introduction layer P1 constitutes a source region or a drain region of the P-channel MOS field effect transistor PM1. That is, in this embodiment, one word line driver circuit WLD includes two N-channel MOS field effect transistors NM1 connected in parallel and two P-channel MOS field effect transistors PM1 connected in parallel.

The word line WL is composed of a metal wiring layer of a second layer (M2) provided so as to extend in the X direction. As shown in FIG. 9, the output terminal o of the word line driver circuit WLD is connected to the first portion X1 of the word line WL or the proximal end WLA of the word line WL via the metal wiring layer (not shown) of the first layer and the via electrode V11. The second part X2 or the far end WLB of the word line WL is connected to the drain of the P-channel MOS field effect transistor P12 in the word line pull up circuit WLPU by, for example, a metal-wiring layer (not shown) of a first layer (not shown), although the second part X2 or the far end WLB of the word line WL is not shown in FIG. 8.

The memory array MCA includes a plurality of memory cells MC connected to the third portion X3 of the word line WL. The plurality of memory cells of the memory array MCA includes a first memory cell (MC1) connected to the fourth portion X4 of the word line WL, and a second memory cell (MC2) connected to the fifth portion X5 of the word line WL. Each of the layouts of the memory cells MC, MC1, and MC2 may utilize the layout configuration MCL of the memory cell MC shown in FIG. 4. The gate connecting nodes ND1, ND2 of the access transistors NA1 and NA2 of the memory cell (MC, MC1, MC2) are connected to the word line WL via the metal wiring layer (not shown) of the first layer and the via electrode V12, V13, V14, V15, and V16 as shown in FIG. 9.

The second wiring L2 is formed of a metal wiring layer of a third layer M3 provided so as to extend in the X direction. The second wiring L2 may also be configured by, for example, a metal wiring layer of a fourth layer (above M3) above the metal wiring layer of the third layer (M3). As shown in FIG. 9, the second wiring L2 is provided in parallel on the upper side of the word line WL in the memory array MCA. The first portion Y1 of the second wiring L2 is connected to the sixth portion X6 of the word line WL via the via electrode V21. The second portion Y2 of the second wiring L2 is connected to the wiring LIN2 configured by the metal wiring layer of the second layer (M2) via the via electrode V22, and the wiring LIN2 is further connected to the input terminal of the inverter circuit IV2 in the word line pull up circuit WLPU via the via electrode V17 and the metal wiring layer (not shown) of the first layer.

The inverter circuit IV2 of the word line pull up circuit WLPU has a third gate electrode G3 and a fourth gate electrode G4 composed of polycrystalline (POLY) provided so as to extend in the X direction, an N-type impurity introduction layer (DIFF) N2 into which an N-type impurity is introduced, and a P-type impurity introduction layer (DIFF) P2 into which a P-type impurity is introduced. The third gate electrode G3 and the fourth gate electrode G4 constitute the gate electrode of the N-channel MOS field effect transistor and the P-channel MOS field effect transistor constituting the inverter circuit IV2, respectively. The N-type impurity introduction layer N2 constitutes a source region or a drain region of the N-channel MOS field effect transistor constituting the inverter circuit IV2. The P-type impurity introduction layer P2 constitutes a source region or a drain region of the P-channel MOS field effect transistor constituting the inverter circuit IV2.

As shown in FIGS. 8 and 9, a second wiring L2 having a smaller load than the load of the word line WL can be provided so as to run in parallel on the upper side of the word line WL.

(Modified Example of a Layouts of a Second Wiring L2)

Figure 10:
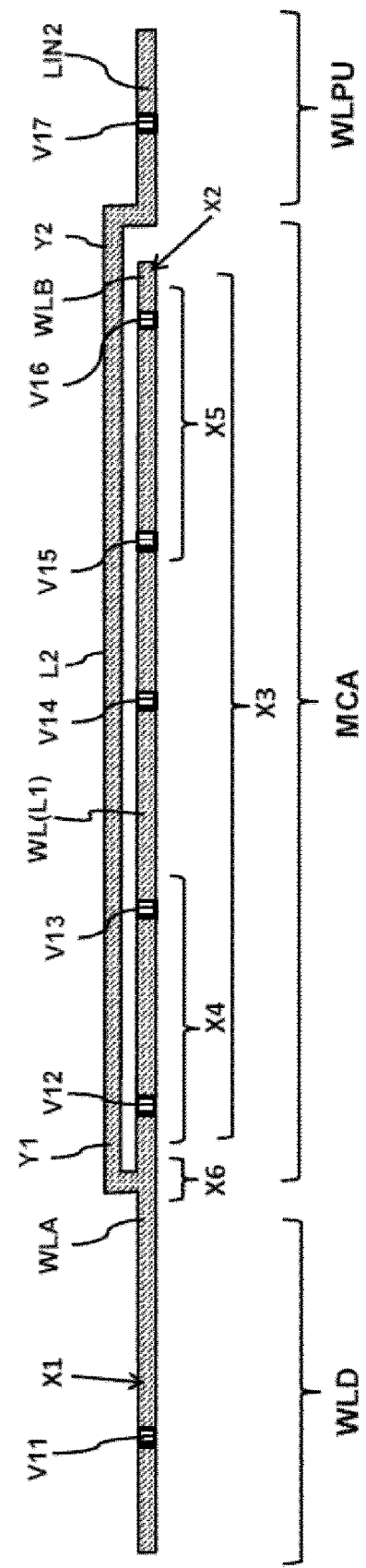
FIG. 10 is a diagram showing a modified example of the layout of the second wiring.

In FIGS. 8 and 9, the second wiring L2 is provided so as to run in parallel on the upper side of the word line WL, but the present invention is not limited thereto. The second wiring L2 may be provided to run alongside the word line WL. FIG. 10 is a diagram showing a modified example of a layout of the second wiring L2. In FIG. 10, configurations having the same function as that in FIGS. 8 and 9 is denoted by the same sign, and descriptions thereof are omitted. Similarly to FIG. 8, in FIG. 10, the first via electrodes V11 to V17 schematically show locations where the respective via electrodes are formed.

FIG. 10 differs from FIG. 8 and FIG. 9 in that the second wiring L2 in FIG. 10 branches upward from the word line WL in the sixth portion X6 of the word line WL in plan view, and runs in parallel to the word line WL in the memory array MCA. Then, at the second portion Y2 of the second wiring L2, it is bent downward to constitute the wiring LIN2, and is connected to the input terminal of the inverter circuit IV2 in the word line pull up circuit WLPU via the via electrode V17 and the metal wiring layer of the first layer (not shown).

As shown in FIG. 10, the second wiring L2 smaller than the load of the WL can be provided so as to run in parallel on the lateral side of the word line WL.

According to first embodiment, the following effects can be obtained.

1) Since the load of the second wiring L2 is smaller than the load of the word line WL, the second portion Y2 of the second wiring L2 transitions from the low level to the high level prior to the second portion X2 or distal end WLB of the word line WL transitioning from the low level to the high level. As a result, the output signal of the inverter circuit IV2 in the word line pull up circuit WLPU transitions from the high level to the low level, the P-channel MOS field effect transistor P12 in the word line pull up circuit WLPU is turned on, and the potential of the second portion X2 or the far end portion WLB of the word line WL is pulled up based on the potential generated by the power supply potential generation circuit VWL.

2) Since the pull-up operation of the second portion X2 or the distal end WLB of the word line WL can be started quickly by the word line pull up circuit WLPU, it is possible to speed up the potential transition in the second portion X2 or the distal end WLB of the word line WL. Thus, for example, although slightly delayed from the transition of the first memory cell (MC1) connected to the fourth portion X4 of the word line WL to the selected state, the transition of the second memory cell (MC2) connected to the fifth portion X5 of the word line WL to the selected state can be speeded up, thereby speeding up the entire address access time in the read operation of the memory device 102 and the write operation.

Next, the second embodiment will be described. In the second embodiment, the same sign is attached to a configuration having the same function as the first embodiment, and descriptions thereof are omitted. In second embodiment, another exemplary configuration of the unit circuit 4 of the first embodiment will be described.

Figure 11:
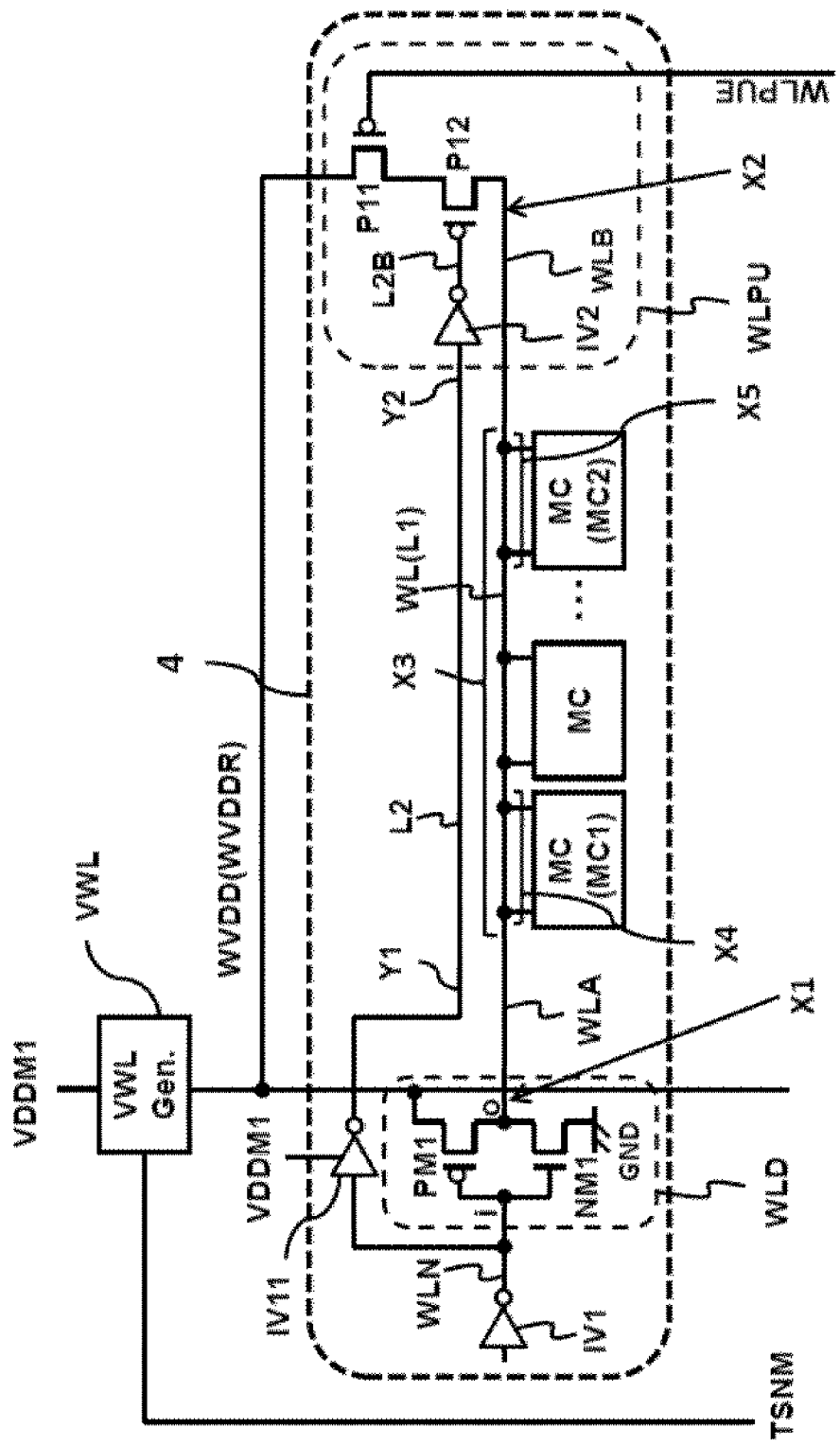
FIG. 11 is a diagram illustrating an exemplary configuration of a unit circuit according to the second embodiment.

FIG. 11 is a diagram illustrating an exemplary configuration of the unit circuit 4 according to the second embodiment. FIG. 11 differs from FIG. 3 in that, in FIG. 11, the first portion (proximal end) Y1 of the second wiring L2 is connected to the output of the inverter IV11, and the input of the inverter IV11 is connected to the output of the inverter IV1 via the wiring WLN. The other configuration of FIG. 11 is the same as that of FIG. 3. The inverters IV11 are supplied with the first memory power supply potential VDDM1 and the ground potential GND as power supply.

In FIG. 11, when the pull up enable signal WLPUE is set to an activation level such as the low level, after the output of the inverter IV1 becomes the low level, the first portion Y1 of the second wiring L2 becomes the high level by the inverter IV11, the second portion Y2 of the second wiring L2 becomes the high level, and the wiring L2B becomes the low level by the inverter IV2. This causes the word line pull up circuit WLPU to operate.

(Example of an Operation)

Figure 12:
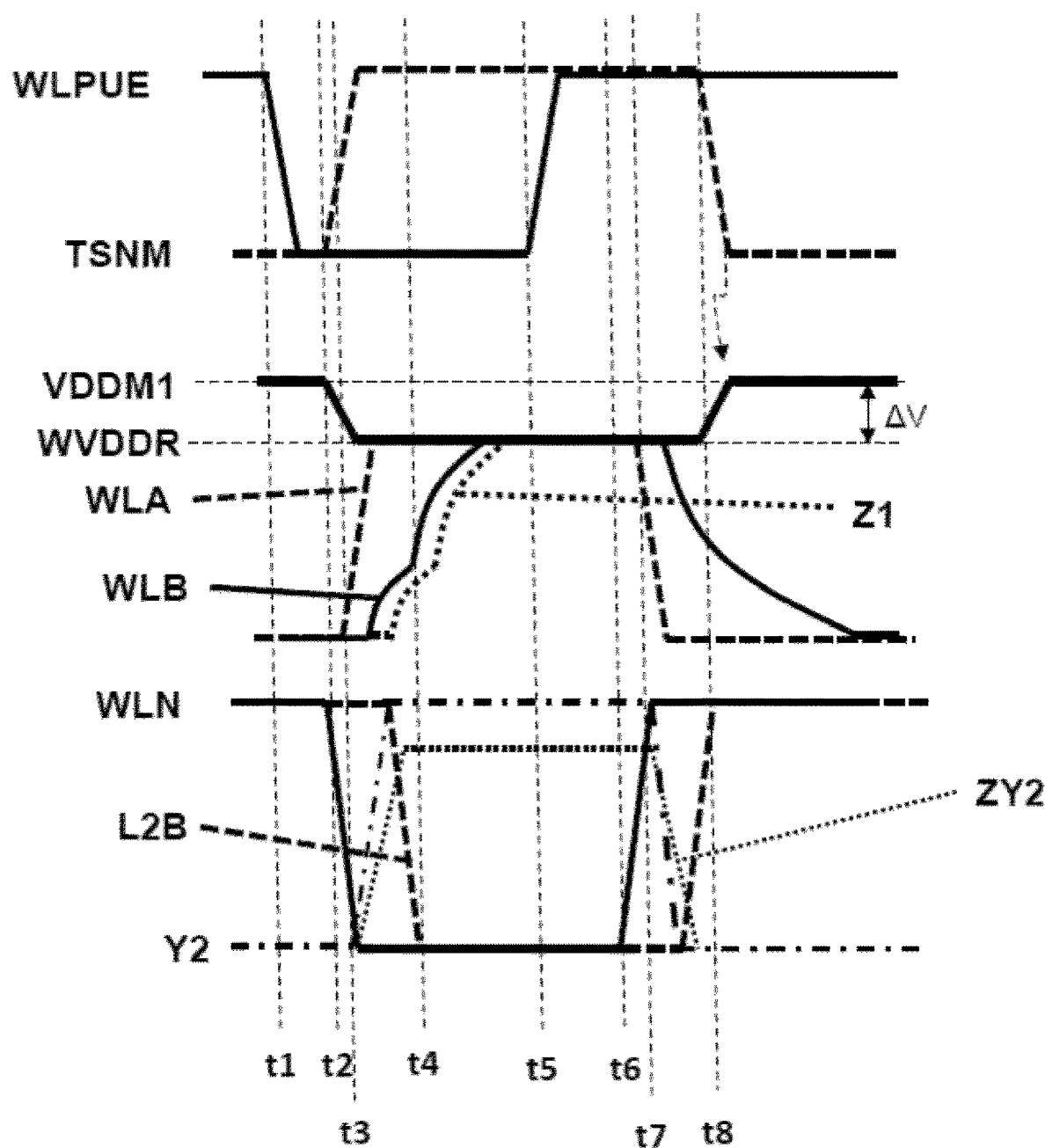
FIG. 12 is a waveform diagram illustrating a potential of the word line at the time of read operation of the unit circuit according to the second embodiment.

FIG. 12 is a waveform diagram illustrating the potential of the word line at the time of the read operation of the unit circuit 4 according to the second embodiment. In FIG. 12, a dotted line Z1 indicates the potential level of the distal end WLB of the word line WL in the first embodiment, and a dotted line ZY2 indicates the potential level of the distal end Y2 of the second wiring L2 in the first embodiment.

At time t1, the pull up enable signal WLPUE transitions from an unselected level such as the high level to a selection level such as the low level. As a result, the P-channel MOS field effect transistor P11 is turned on.

At the time t2, the control signal TSNM is transitioned from a non activation level such as the low level to an activation level such as the high level. As a result, the power supply potential generating circuit VWL pulls down the first memory power supply potential VDDM1 by the potential difference ΔV to generate the word line power supply potential WVDDR (=VDDM1-ΔV) at the time of reading.

At the time t2, the potential level of the wiring WLN connected to the output of the inverter IV1 is shifted from an unselected level such as the high level to a selection level such as the low level. This causes the word line WL to an activation and the proximal end WLA of the word line WL to a transition from an unselected level such as the low level to a selection level such as the high level at the time t3. Note that the potential of the selection level of the word line WL is word line power supply potential WVDDR at the time of reading. The potential of the distal end WLB of the word line WL gradually rises. On the other hand, since the load of the second wiring L2 is smaller than the load of the word line WL, the potential of the distal end Y2 of the second wiring L2 sharply rises to the first memory power supply potential VDDM1. As a result, the potential level of the wiring L2B connected to the output terminal of the inverter circuit IV2 transitions from an unselected level such as the high level to a selected level such as the low level, and the P-channel MOS field effect transistor P12 is turned on. Therefore, at the time t4, the potential of the distal end WLB of the word line WL rises sharply, and transitions to a selection level such as the high level. In FIG. 12, a waveform indicated by a dotted line Z1 indicates a potential change of the distal end WLB of the word line WL in the first embodiment. As will be appreciated from FIG. 12, since the load of the word line WL of second embodiment is small compared to the load of the word line WL of first embodiment, the start time and the transition time to the selection level of the transition of the level of distal end WLB of the present Embodiment shown by the solid line, as compared to the waveform indicated by the dotted line Z1, it is done in an early time.

At time t5, the pull up enable signal WLPUE transitions from a selection level such as the low level to an unselected level such as the high level. As a result, the P-channel MOS field effect transistor P11 is turned off.

At time t6, the potential level of the wiring WLN connected to the output of the inverter IV1 is transitioned from a selection level such as the low level to an unselected level such as the high level to deactivate the word line WL. As a result, At time t7, the proximal end WLA of the word line WL transitions from a selection level such as the high level to an unselected level such as the low level, and the distal end Y2 of the wiring L2 transitions from a selection level such as the high level to an unselected level such as the low level. Then, the distal end WLB of the word line WL gradually transitions from a selection level such as the high level to an unselected level such as the low level. The potential level of the wiring L2B connected to the output terminal of the inverter circuit IV2 changes from a selection level such as the low level to a non-selection level such as the high level, and the P-channel MOS field effect transistor P12 is turned off.

At time t8, the control signal TSNM is transitioned from an activation level such as the high level to a non activation level such as the low level. As a result, in the potential level of the power supply potential generated by the power supply potential generating circuit VWL, the word line power supply potential WVDDR at the time of reading is returned to the first memory power supply potential VDDM1.

According to second embodiment, the following effect can be obtained.

The second wiring L2 is driven not by the output signal of the word line driver circuit WLD but by the inverter IV11 driven by the inverter IV1 which is the preliminary circuit of the word line driver circuit WLD and the output signal of the inverter IV1. Therefore, the word line driver circuit WLD drives the word line WL having less load than the first embodiment. Thus, the first portion X1 or the proximal end WLA of the word line WL can transition from the low level to the high level faster compared to first embodiment.

In addition, in an advanced process in which a wiring resistance is high, if the gate width of the transistor (PM1, NM1) constituting the word line driver circuit WLD is increased, a selection operation of the word line WL is often not speeded up, and an area occupied by the word line driver circuit WLD shown in FIG. 8 of the first embodiment cannot be effectively utilized in some cases. In the second embodiment, since an inverter IV11 is required separately from the word line driver circuit WLD, the gate widths of the transistors PM1,NM1 constituting the word line driver circuit WLD are designed to be small, and an inverter IV11 is provided in an empty region. As a result, the area of the semiconductor chip can be effectively utilized. In addition, since the inverter IV11 does not need to operate at the power supply potential WVDDR lower than the first memory power supply potential VDDM1, the inverter can drive the second wiring L2 at a higher speed.

Next, some modified example of the second embodiment will be described.

First Modified Example

Figure 13:
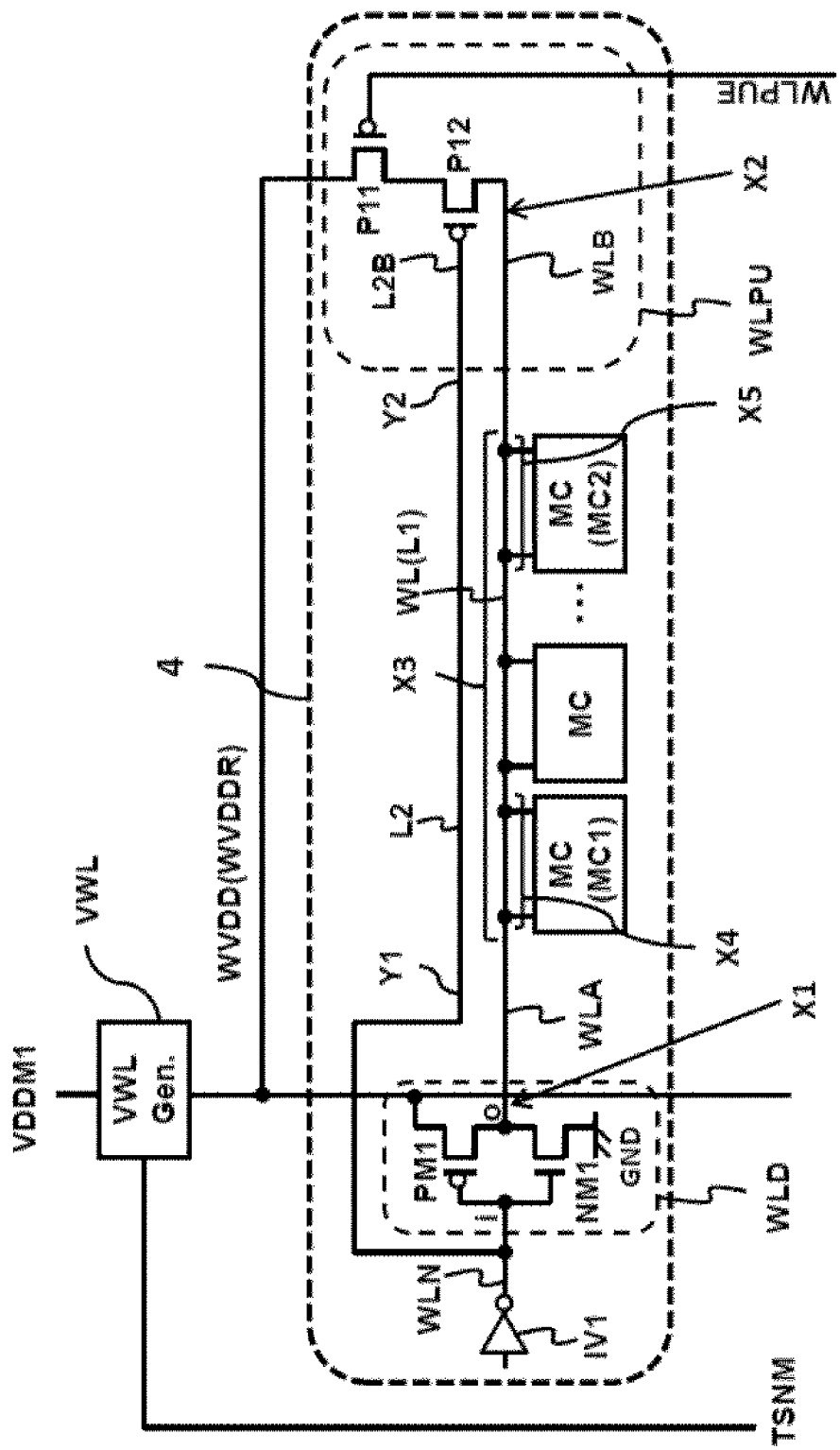
FIG. 13 is a diagram showing an exemplary configuration of a unit circuit according to a first modified example.

In a first modified example, the same sign is attached to a configuration having the same function as that of the second embodiment, and descriptions thereof are omitted. FIG. 13 is a diagram showing an exemplary configuration of the unit circuit 4 according to the first modified example. FIG. 13 differs from FIG. 11 in that the inverters IV11, IV2 are deleted in FIG. 13. The other configuration of FIG. 13 is the same as that of FIG. 11.

In the first modification, the first portion (proximal end) Y1 of the second wiring L2 is directly connected to the wiring WLN connected to the output of the inverter IV1, and the second portion (distal end) Y2 of the second wiring L2 is connected to the gate of the P-channel MOS field effect transistor P12 in the word line pull up circuit WLPU via the wiring L2B. Therefore, the second wiring L2 is directly driven by the output signals of the inverters IV1.

According to the first modified example, since the inverters IV11, IV2 are deleted, the area of the semiconductor chip can be reduced.

Second Modified Example

Figure 14:
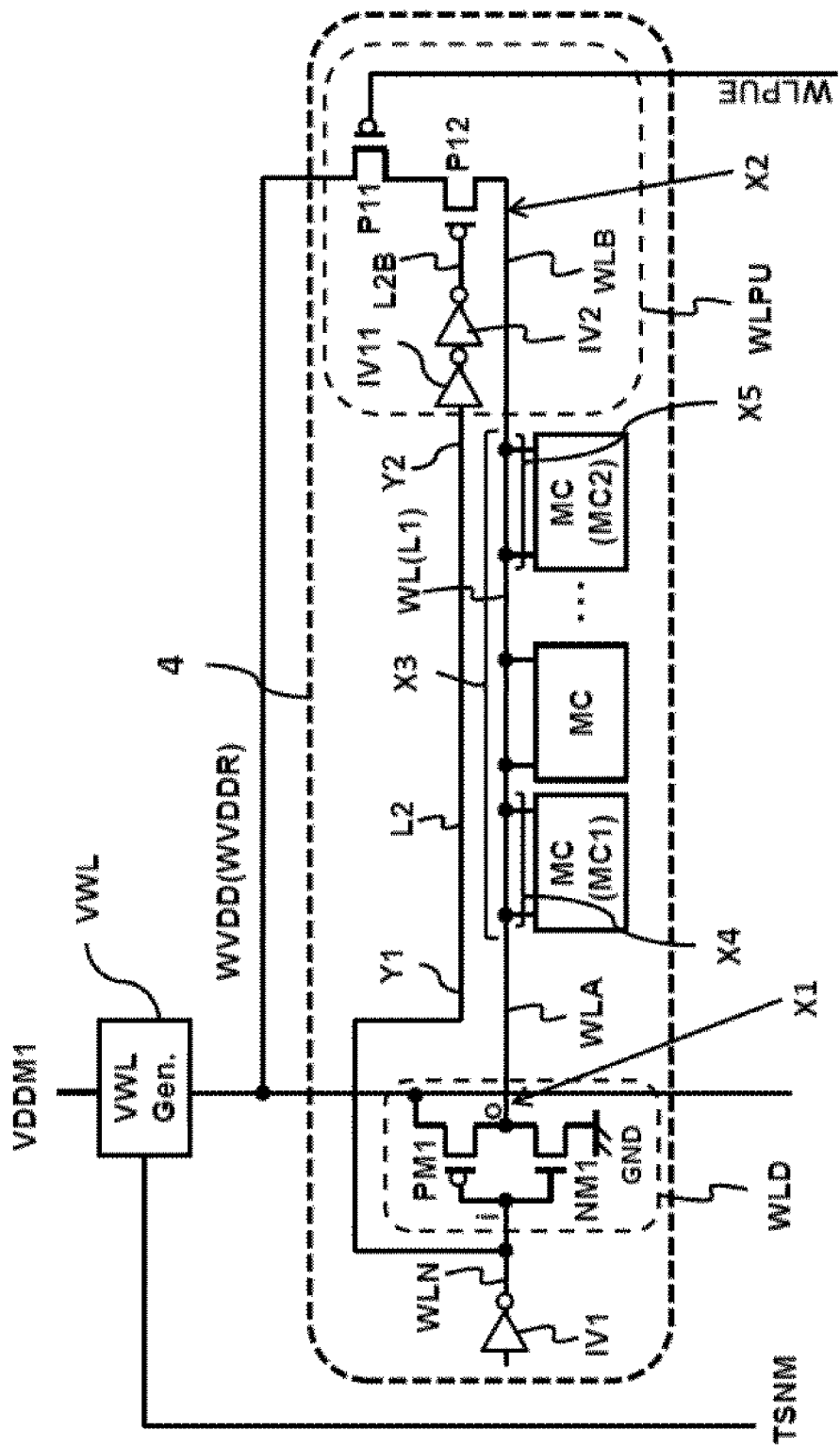
FIG. 14 is a diagram showing an exemplary configuration of a unit circuit according to a second modified example.

In the second modified example, the same sign is attached to a configuration having the same function as that of the second embodiment, and descriptions thereof are omitted. FIG. 14 is a diagram showing an exemplary configuration of the unit circuit 4 according to the second modified example. FIG. 14 differs from FIG. 11 in that the inverter IV11 is arranged in the word line pull up circuit WLPU in FIG. 14. The other configuration of FIG. 14 is the same as that of FIG. 11.

In the second modification, the first portion (proximal end) Y1 of the second wiring L2 is directly connected to the wiring WLN at the output of the inverter IV1, and the second portion (distal end) Y2 of the second wiring L2 is connected to the gate of the P-channel MOS field effect transistor P12 in the word line pull up circuit WLPU via the two inverters IV11, IV2. The two inverters IV11, IV2 located in the word line pull up circuit WLPU have a role of waveform shaping.

According to the second modified example, high speed pull up operation of the word line pull up circuit WLPU is enabled by a waveform shaping of the output of the inverter IV1 with the two inverters IV11, IV2.

Third Modified Example

Figure 15:
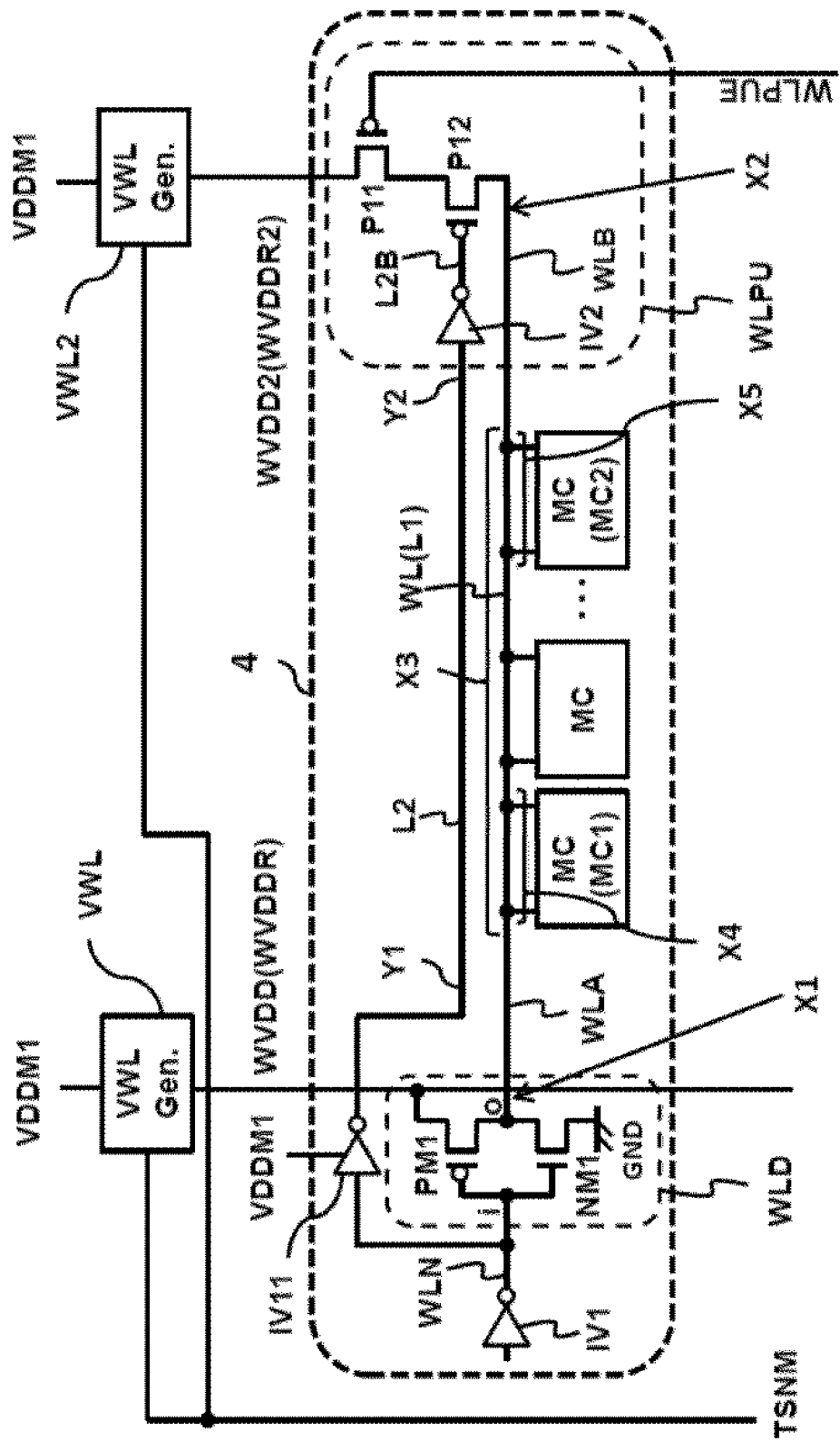
FIG. 15 is a diagram showing an exemplary configuration of a unit circuit according to a third modified example.

In the third modified example, the same sign is attached to a configuration having the same function as that of the second embodiment, and descriptions thereof are omitted. FIG. 15 is a diagram showing an exemplary configuration of the unit circuit 4 according to the third modified example. FIG. 15 differs from FIG. 11 in that a power supply potential generating circuit VWL2 different from the power supply potential generating circuit VWL is provided in FIG. 15. The other configuration of FIG. 15 is the same as that of FIG. 11.

The output potential WVDD2 of the power supply potential generating circuit VWL 2 is connected to the source of the P-channel MOS field effect transistor P11 in the word line pull up circuit WLPU. The configuration and operation of the power supply potential generating circuit VWL2 are the same as the configuration and operation of the power supply potential generating circuit VWL of the first embodiment, and therefore descriptions thereof are omitted. The potential level of the output potential WVDD2 of the power supply potential generating circuit VWL2 becomes a potential (VDDM1-ΔV) obtained by stepping down a potential difference ΔV from the first memory power supply potential VDDM1, based on the high level of the control signal TSNM. Here, the VDDM1-ΔV becomes a power supply potential WVDDR2 at the time of reading the word line driver circuit WLD of the memory device 102.

In FIG. 11, since the output potential WVDD of the power supply potential generating circuit VWL is connected to the word line driver circuit WLD and the word line pull up circuit WLPU, the load of the power supply potential generating circuit VWL is large. Therefore, prior to the pull-down of the output potential WVDD, the output potential word line WL may rise to high level, and the memory cell MC may not operate stably.

In the third modified example, the power supply potential generating circuit VWL2 is also provided on the side of the word line pull up circuit WLPU. On the side of the word line driver circuit WLD, the power supply potential generating circuit VWL generates the output potential WVDD, and on the word line pull up circuit WLPU side, the power supply potential generating circuit VWL2 generates the output potential WVDD2. Since the load of the power supply potential generating circuit VWL is reduced, the output potential WVDD, WVDD2 can be quickly pulled down to the power supply potential WVDDR and WVDDR2 at the time of reading the word line driver circuit WLD.

Fourth Modified Example

Figure 16:
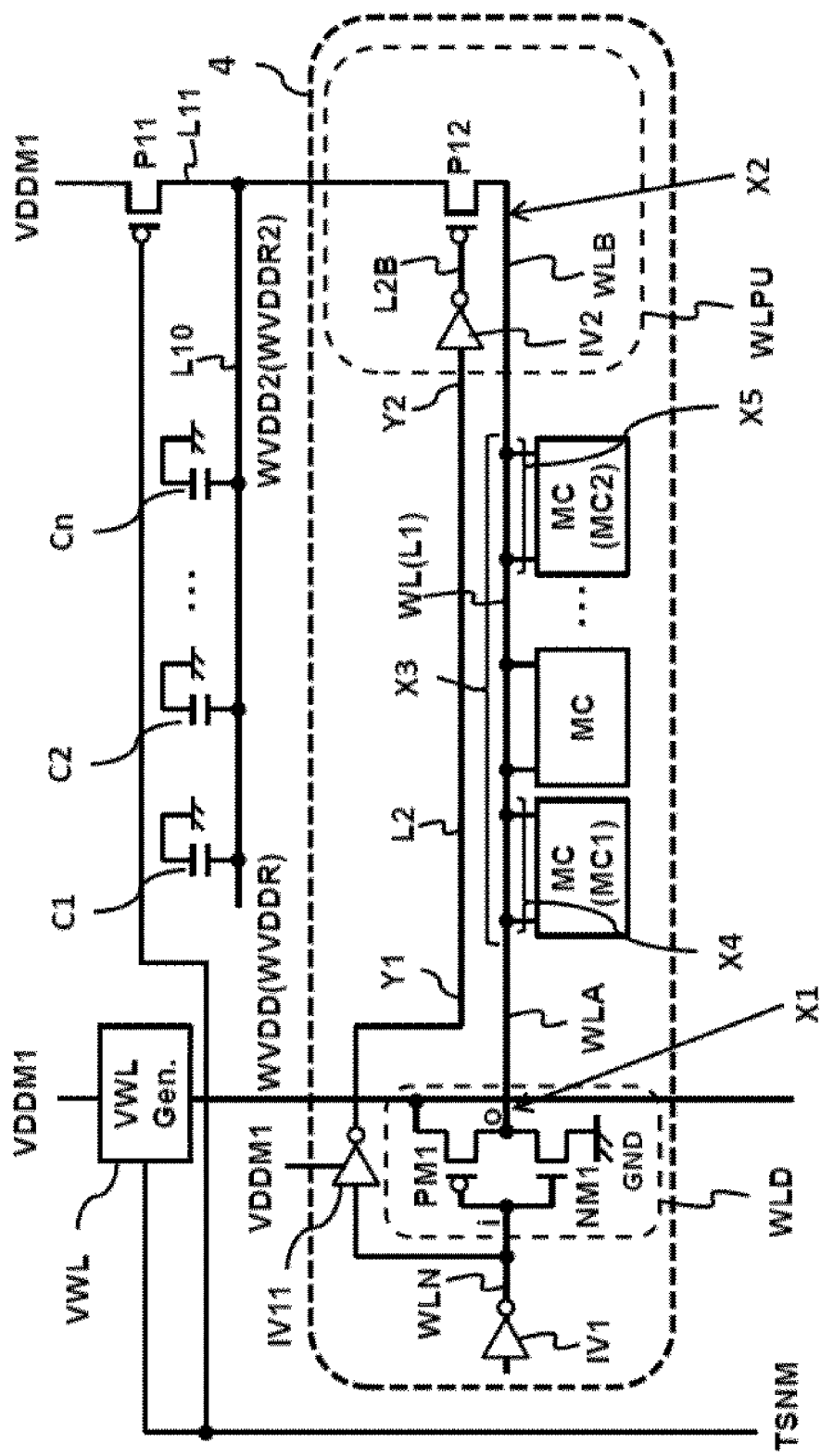
FIG. 16 is a diagram showing an exemplary configuration of a unit circuit according to a fourth modified example.
Figure 17:
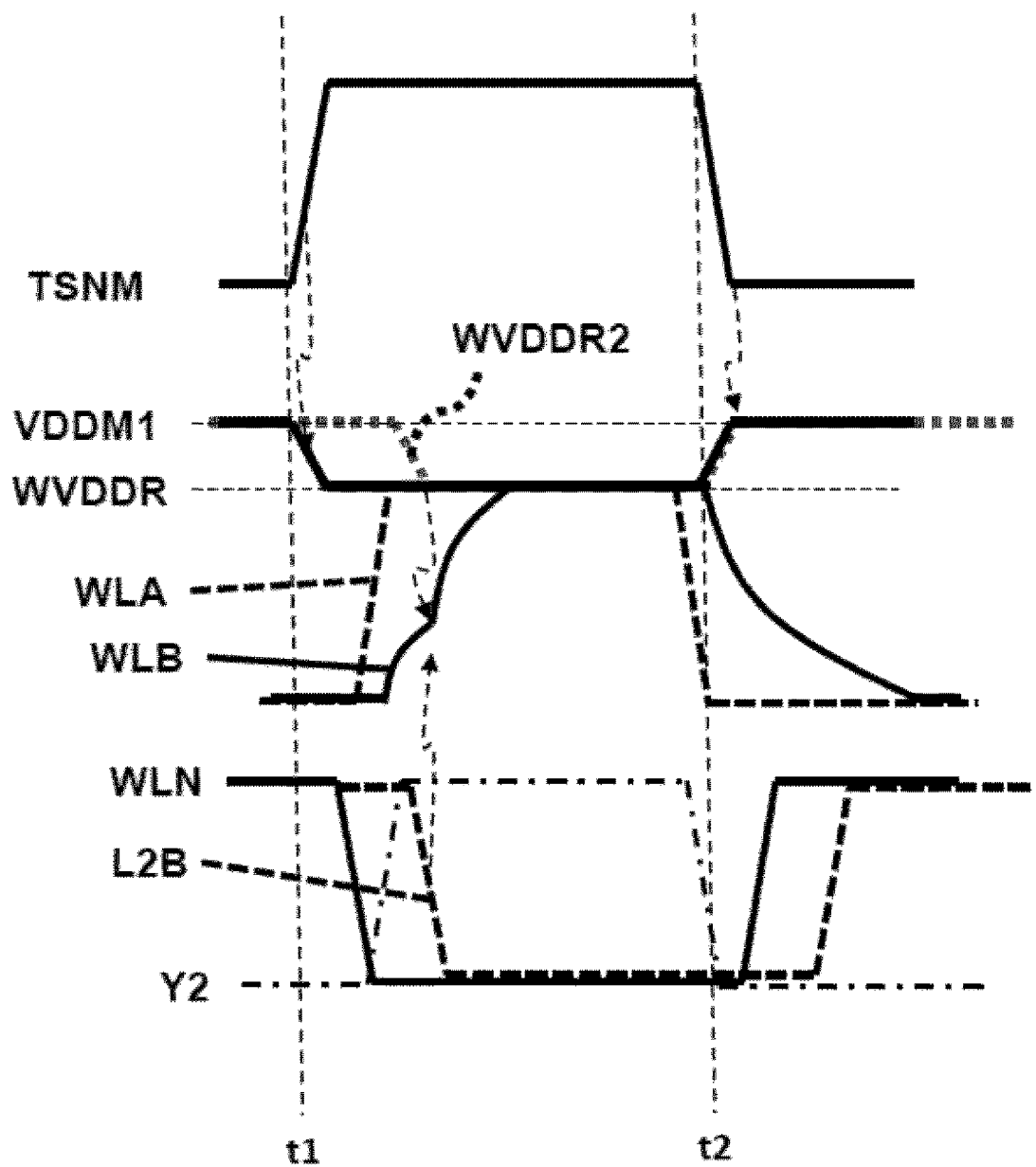
FIG. 17 is a waveform diagram for explaining a potential of the word line at the time of read operation of the unit circuit relating to a fourth modified example.

In the fourth modified example, the same sign is attached to a configuration having the same function as that of the third modified example, and descriptions thereof are omitted. FIG. 16 is a diagram showing an exemplary configuration of the unit circuit 4 according to the fourth modified example. FIG. 17 is a waveform diagram illustrating the potential of the word line at the time of a read operation of the unit circuit 4 according to the fourth modified example. FIG. 16 differs from FIG. 15 in that, in FIG. 16, the output potential WVDD2 is generated by using the parasitic capacitance elements C1 to Cn simulating the memory cell MC, and in that the capacitance elements C1 to Cn are charged by the P-channel MOS field effect transistor P11 receiving the control signal TSNM at its gate. The other configuration of FIG. 16 is the same as that of FIG. 15.

The source of the P-channel MOS field effect transistor P11 is connected to the first memory power supply potential VDDM1 and the gate of the P-channel MOS field effect transistor P11 is connected to receive the control signal TSNM. The drain of the P-channel MOS field effect transistor P11 is connected to the wiring L10 to which the capacitor elements C1 to Cn simulating the memory cell MC are connected, and is connected to the drain of the P-channel MOS field effect transistor P12 in the word line pull up circuit WLPU using the wiring L11. The wiring L10 is provided in parallel with the word line WL.

Next, the operation of the fourth modified example will be described with reference to FIG. 17.

When the control signal TSNM is the low level, since the P-channel MOS field effect transistor P11 is turned on, the wiring L10 is connected to the first memory power supply potential VDDM1, and the capacitive element C1 to Cn are charged.

At time t1, when the control signal TSNM becomes the high level, the P-channel MOS field effect transistor P11 becomes off state and the wiring L10 becomes a floating state. The power supply potential generating circuit VWL generates an output potential WVDDR.

When the potential level of the wiring WLN connected to the output of the inverter IV1 is the low level, the proximal end WLA of the word line WL is the high level, the distal end Y2 of the second wiring L2 is the high level, and the wiring L2B is the low level, the P-channel MOS field effect transistor P12 in the word line pull up circuit WLPU is turned on (ON). Thus, the power supply potential WVDDR2 is generated based on the charges charged in the capacitive elements C1 to Cn, and the distal end WLB of the word line WL is pulled up using the generated power supply potential WVDDR2. That is, the distal end WLB of the word line WL is pulled up by the charges charged in the capacitive elements C1 to Cn.

At time t2, when the control signal TSNM transitions from the high level to the low level, the P-channel MOS field effect transistor P11 is turned on, and the capacitive elements C1 to Cn connected to the wiring L10 are charged.

According to the fourth modified example, since the charges charged in the capacitive elements C1 to Cn are supplied to the word line WL, the word line WL does not rise to the first memory power supply potential VDDM1, so that the memory cell MC can perform a stable operation. Further, since the capacitive elements C1 to Cn simulate a plurality of memory cells MC connected to the word line WL, equivalent effect can be obtained if the number of word line of the memory array MCA and the number of complementary pair of bit lines (BT, /BT) are changed.

Fifth Modified Example

Figure 18:
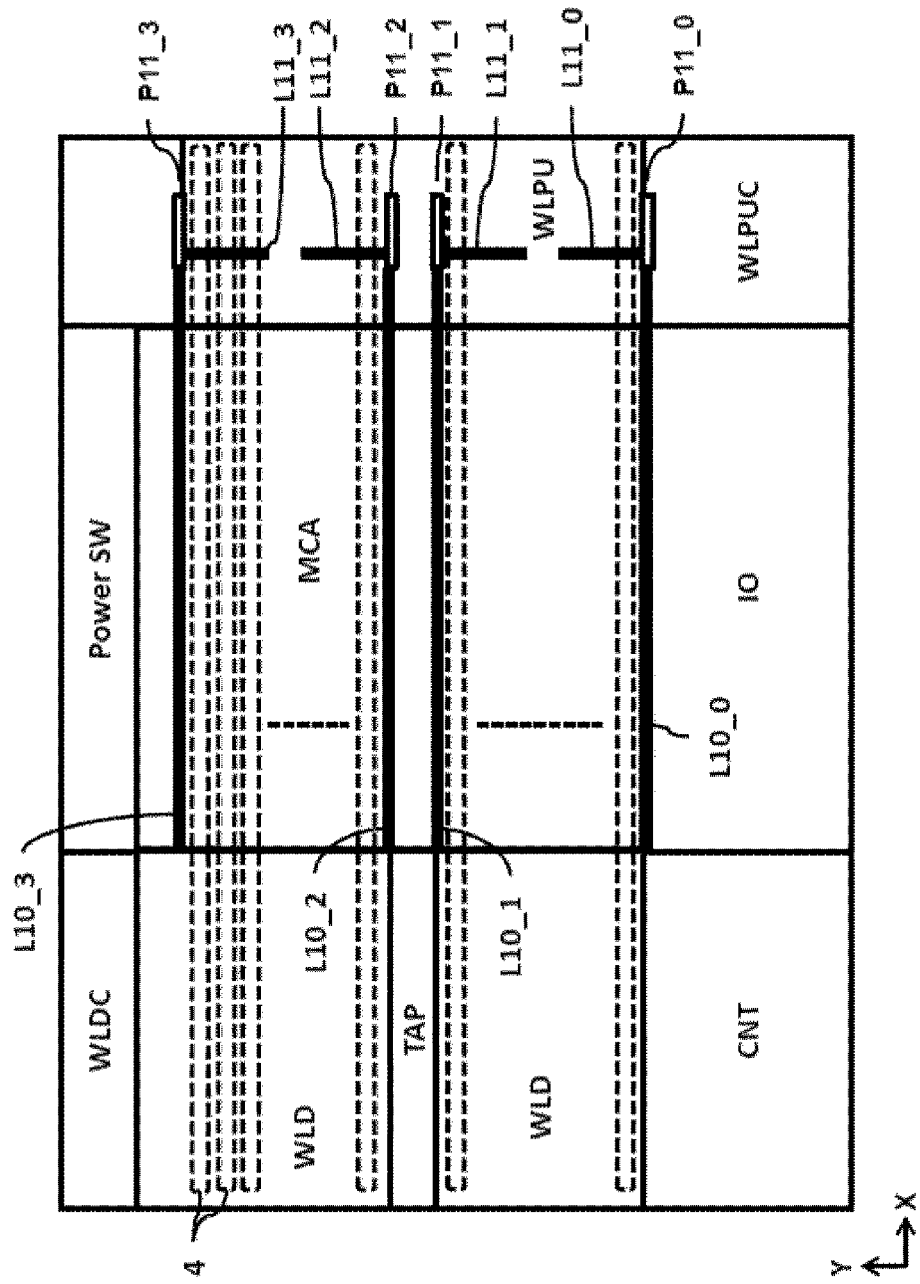
FIG. 18 is a diagram showing an exemplary configuration of a memory device according to a fifth modified example.

In the fifth modified example, the same sign is attached to a configuration having the same function as that of the fourth modified example, and descriptions thereof are omitted. FIG. 18 is a diagram showing an exemplary configuration of a memory device according to the fifth modified example. In the fifth modified example, a layout arrangement of the wirings L10_0, L10_1, L10_2, and L10_3 on the memory device 102 is described in a case where a plurality of wirings L10 described in the fourth modified example (wiring L10_0, L10_1, L10_2, and L10_3) are provided. Then, each of the wirings L10_0, L10_1, L10_2, and L10_3 is shared for a plurality of unit circuit 4. In FIG. 18, capacitive elements C1~Cn added to each of the wirings L10_0, L10_1, L10_2, and L10_3 are not described, but similarly to the wiring L10 described in the fourth modified example, capacitive elements C1-Cn are added to each of the wirings L10_0, L10_1, L10_2, and L10_3.

As shown in FIG. 18, a plurality of unit circuits 4 described in the fourth modified example are arranged in the memory array MCA. In the memory array MCA, in one example, four wirings L10_0, L10_1, L10_2, and L10_3 are provided so as to parallel in the X direction is the same direction as the extending direction of the word line WL. The wiring L10_0 is provided on the lower side of the memory array MCA, the wiring L10_3 is provided on the upper side of the memory array MCA, and the wirings L10_1, 10_2 are provided on the memory array MCA between the wiring L10_0 and the wiring L10_3.

To each of the wirings L10_0, L10_1, L10_2, and L10_3, P-channel MOS field effect transistors P11_0, P11_1, P11_2, and P11_3 corresponding to the P-channel MOS field effect transistor P11 described in the fourth modified example, is connected. Wirings L11_0, L11_1, L11_2, and L11_3 correspond to the wiring L11 described in the fourth modified example. In the region the word line pull up circuit WLPU is formed, wirings L11_0, L11_1, L11_2, and L11_3 are provided extending in the Y direction (vertical direction) different from the extending direction of the word line WL. As exemplarily shown in the portion of the wiring L11_3, the sources of the plurality of P-channel MOS field effect transistors P12 in the plurality of unit circuits 4 described in the fourth modified example are connected. In the wirings L11_0, L11_1, and L11_2, similarly to the wiring L11_3, the sources of the plurality of P-channel MOS field effect transistors P12 in the plurality of unit circuits 4 are also connected.

In FIG. 18, power switch (Power SW) represents a switch element such as a MOS transistor provided to reduce leakage currents of a plurality of memory cells MC, for example. A tap (TAP) indicates a region for connecting an N-type well or a P-type well, in which a plurality of memory cells MC are formed, to a desired reference potential (GND, VDDM2).

In fifth modified example, each of the wiring (L10_0 and L11_0, L10_1 and L11_1, L10_2 and L11_2, L10_3 and L11_3) can be shared by a plurality of rows of word line WL. In the fifth modified example, the wiring L11 of the fourth modified example is divided vertically with the word line WL to have a configuration having a plurality of wirings L10_0, L10_1, L10_2, and L10_3 on the memory array MCA. As shown in the fourth modified example, it is preferable that the wiring L10 has a parasitic capacitance (capacitive elements C1 to Cn) simulating the word line WL, but when the wiring L10 is shared by a plurality of word lines WL, parasitic capacitance (parasitic capacitance of the wiring L11) that is perpendicular to the word line WL occurs. As shown in the fifth modified example, by configuring the wiring L11 of the fourth modified example by wirings L11_0, L11_1, L11_2, and L11_3 divided into in the vertical direction (Y direction) of the word line WL, each parasitic capacitance of the wirings (L10_0 and L11_0, L10_1 and L11_1, L10_2 and L11_2, L10_3 and L11_3) in the word line WL extending direction (X direction) becomes stronger. Therefore, if the number of word line of the memory array MCA and the number of complementary pair of bit lines (BT, /BT) of the memory array MCA are changed, the parasitic capacitance of wiring (L10_0, L11_0, L10_1, L11_1, L10_2, L11_2, L10_3, and L11_3) can simulate the parasitic capacitance of word line WL.

Sixth Modified Example

Figure 19:
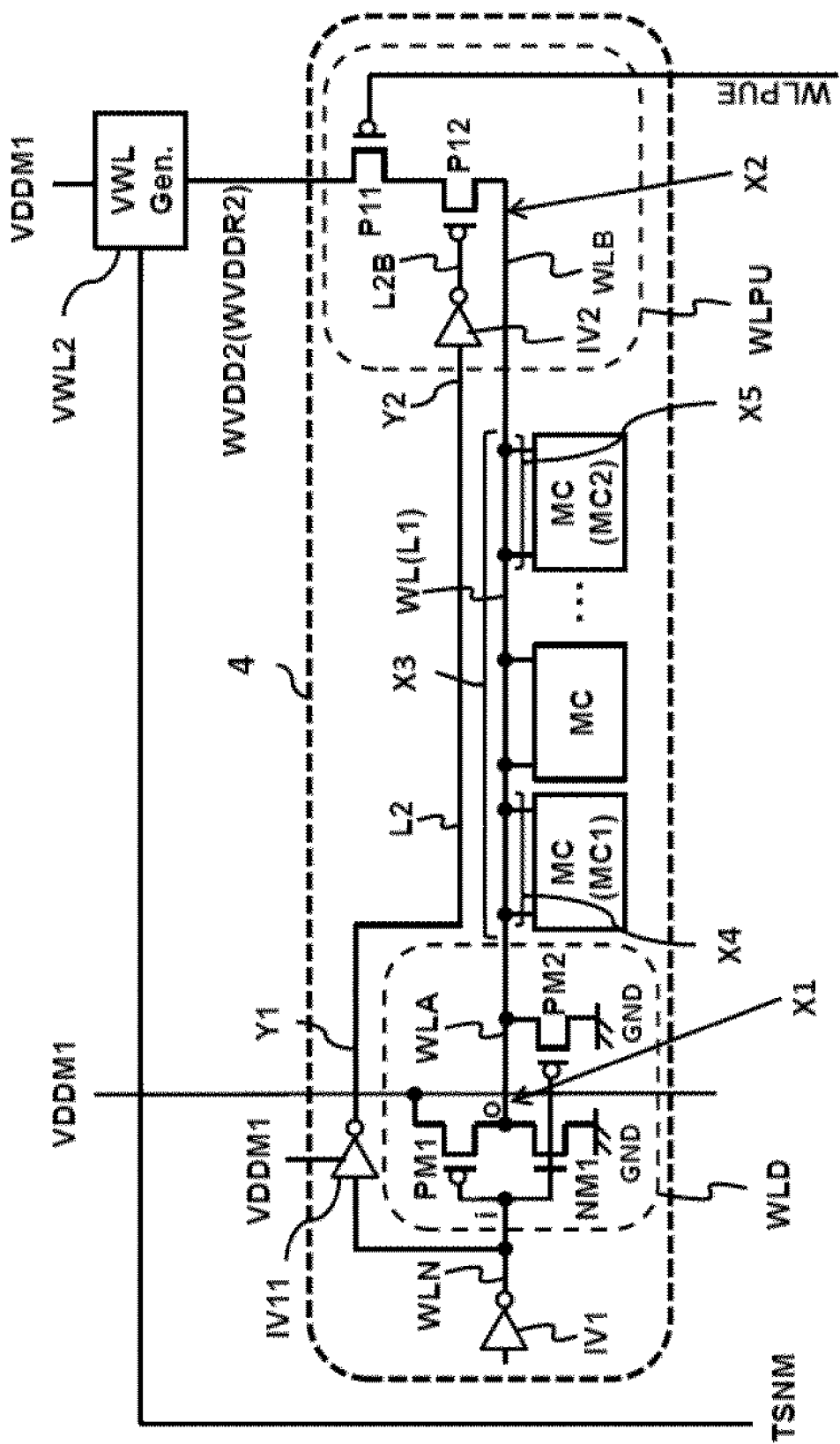
FIG. 19 is a diagram illustrating an exemplary configuration of a unit circuit according to a sixth modified example.

In the sixth modified example, the same sign is attached to a configuration having the same function as that of the third modified example, and descriptions thereof are omitted. FIG. 19 is a diagram illustrating an exemplary configuration of the unit circuit 4 according to the sixth modified example. FIG. 19 differs from FIG. 15 in that, in FIG. 19, the power supply potential generating circuit VWL is deleted and the first memory power supply potential VDDM1 is used as the power supply potential of the word line driver circuit WLD, and the word line driver circuit WLD is provided with the P-channel MOS field effect transistor PM2. The word line driver circuit WLD changes the potential of the word line WL by supplying the first memory power supply potential VDDM1 or the ground potential GND to the output terminal o in accordance with the potential inputted to the input terminal i. The other configuration of FIG. 19 is the same as that of FIG. 15.

The source-drain path of the P-channel MOS field effect transistor PM2 is connected between the word line WL and the wiring to which the grounding potential GND is supplied, and the gate of the P-channel MOS field effect transistor PM2 is connected to the input terminal i of the word line driver WLD. The source of the P-channel MOS field effect transistor PM2 is connected to the circuit terminal o of the word line WL or the output terminal o of the word line driver WLD, and the drain of the P-channel MOS field effect transistor PM2 is connected to the line to which the ground potential GND is supplied.

In the sixth modified example, the P-channel MOS field effect transistor PM2 is directly pulled down to the word line WL, and the power supply potential generating circuit VWL2 is provided to the word line pull up circuit WLPU. The P-channel MOS field effect transistors PM1 and PM2 have drive capability ratios such that a voltage WVDD (WVDDR) equivalent to the output potential WVDD2 (WVDDR2) generated by the power supply potential generating circuit VWL2 can be generated.

While the word line WL is the high level, the control signal TSNM needs to be the high level in order to provide a pulled down power supply potential WVDDR2. However, in the memory device 102 in which the number of word line of the memory array MCA and the number of complementary pair of bit lines (BT, /BT) of the memory array MCA are various, when the power supply control of the word line driver circuit WLD is performed by the control signal TSNM, it is often difficult to adjust the timing. Since the P-channel MOS field effect transistor PM2 for directly pulling down the word line WL is provided, no timing control is required in the power supply control of the word line driver circuit WLD. On the other hand, the power supply potential generating circuit VWL2 of the word line pull up circuit WLPU can control the generation timing of the power supply potential WVDDR2 relatively easily by the two control signals TSNM and the pull up enable signal WLPUE.

Seventh Modified Example

Figure 20:
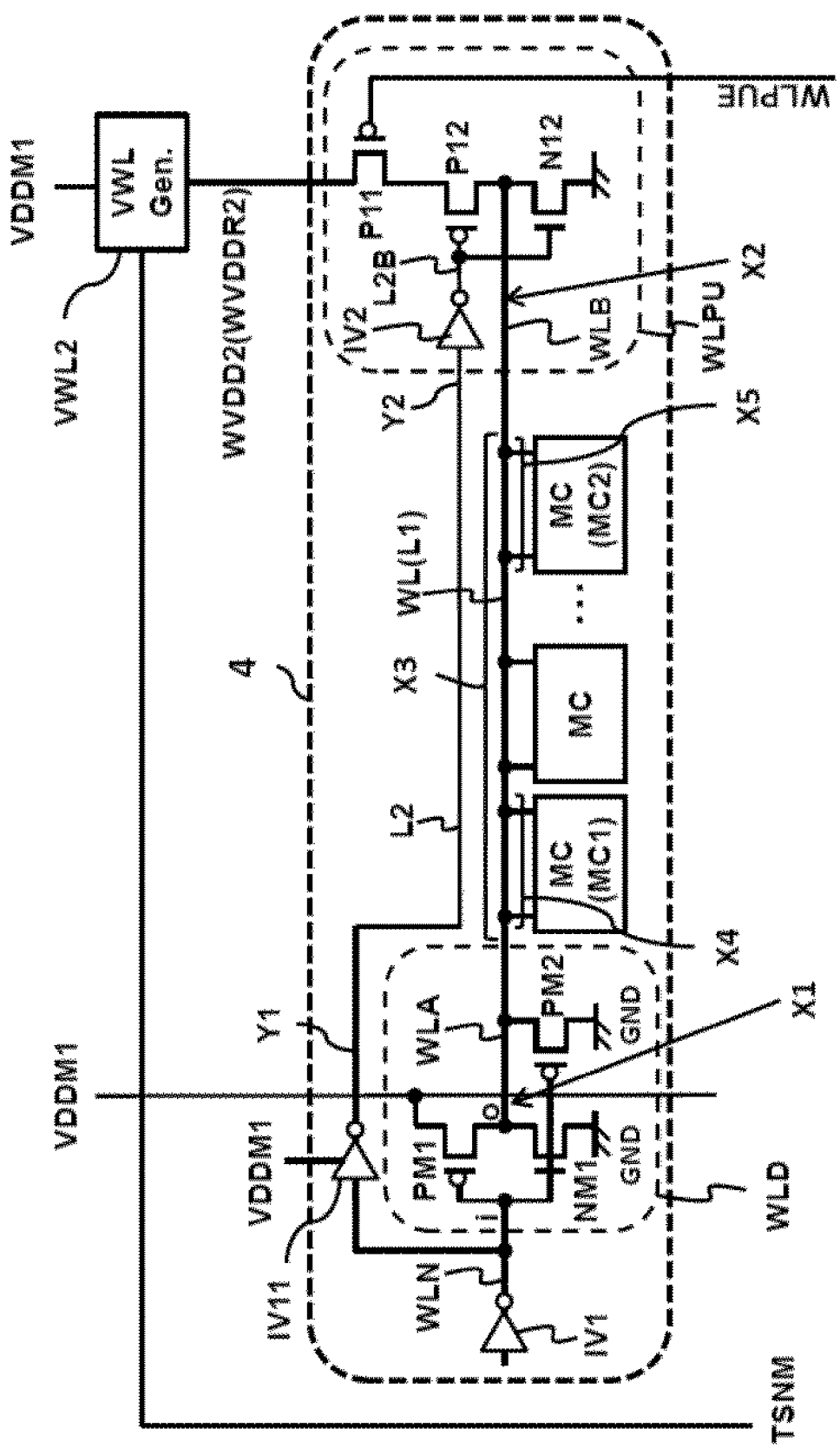
FIG. 20 is a diagram illustrating an exemplary configuration of a unit circuit according to a seventh modified example.
Figure 21:
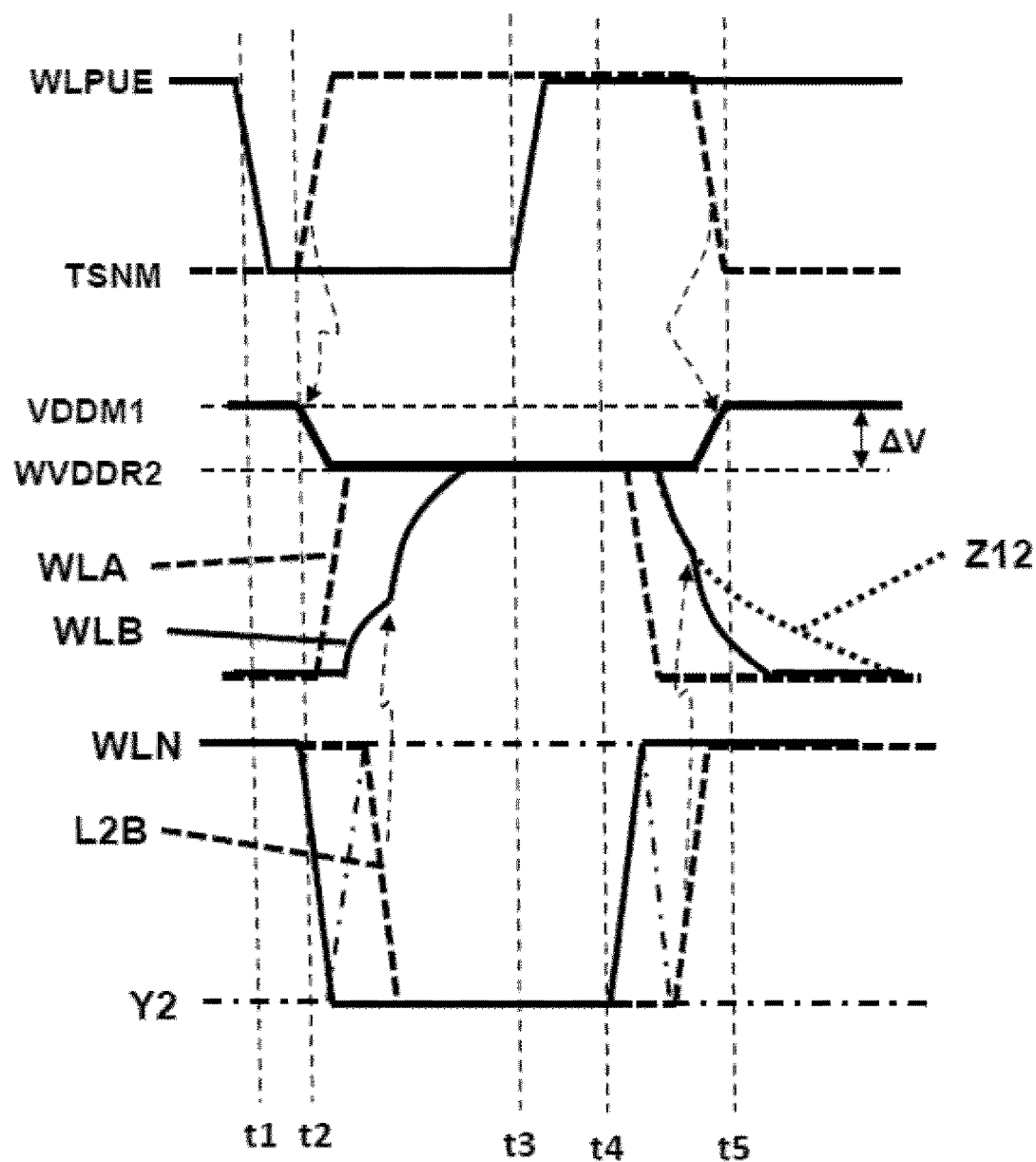
FIG. 21 is a waveform diagram illustrating a potential of the word line at the time of read operation of the unit circuit according to the seventh modified example.

In the seventh modified example, the same sign is attached to a configuration having the same function as the sixth modified example, and descriptions thereof are omitted. FIG. 20 is a diagram illustrating an exemplary configuration of the unit circuit 4 according to the seventh modified example. FIG. 21 is a waveform diagram illustrating the potential of the word line at the time of read operation of the unit circuit 4 according to the seventh modified example. FIG. 20 differs from FIG. 19 in that N-channel MOS field effect transistor N12 is provided in the word line pull up circuit WLPU in FIG. 20. The other configuration of FIG. 20 is the same as that of FIG. 19.

The gate of the N-channel MOS field effect transistor N12 is connected to the gate of the P-channel MOS field effect transistor P12, and the source-drain path of the N-channel MOS field effect transistor N12 is connected between the word line WL and the ground potential GND at the far end X2 (WLB) of the word line WL. The N-channel MOS field effect transistor N12 pulls down the potential level of the distal end X2 (WLB) of the word line WL from a selection level such as high level to an unselected level such as low level based on the high level of the output signals of the inverters.

Next, the operation of the seventh modified example will be described with reference to FIG. 21.

At time t1, the pull up enable signal WLPUE transitions from an unselected level such as the high level to a selection level such as the low level. As a result, the P-channel MOS field effect transistor P11 is turned on.

At time t2, the control signal TSNM is transitioned from a non activation level such as the low level to an activation level such as the high level. As a result, the power supply potential generating circuit VWL2 pulls down the first memory power supply potential VDDM1 by the potential difference ΔV to generate the word line power supply potential WVDDR2 (=VDDM1-ΔV) at the time of reading.

In addition, the potential level of the wiring WLN connected to the output of the inverter IV1 is shifted from an unselected level such as the high level to a selection level such as the low level. This activates the word line WL, and the proximal end WLA of the word line WL transitions from an unselected level such as the low level to a selection level such as the high level. Note that the potential of the selection level of the word line WL is the word line power supply potential WVDDR2 at the time of reading. The potential of the distal end WLB of the word line WL gradually rises.

On the other hand, since the load of the second wiring L2 is smaller than the load of the word line WL, the potential of the distal end Y2 of the second wiring L2 sharply rises to the first memory power supply potential VDDM1. As a result, the potential level of the wiring L2B connected to the output terminal of the inverter circuit IV2 transitions from an unselected level such as the high level to a selected level such as the low level, the P-channel MOS field effect transistor P12 is turned on, and the N-channel MOS field effect transistor N12 is turned off. As a result, the potential of the distal end WLB of the word line WL sharply rises and transitions to a selection level such as high level.

At time t3, the pull up enable signal WLPUE transitions from a selection level such as the low level to an unselected level such as the high level. As a result, the P-channel MOS field effect transistor P11 is turned off.

At time t4, the potential level of the wiring WLN connected to the output of the inverter IV1 is transitioned from a selection level such as the low level to an unselected level such as the high level to deactivate the word line WL. As a result, the proximal end WLA of the word line WL transitions from a selection level such as the high level to an unselected level such as the low level, and the distal end Y2 of the wiring L2 transitions from a selection level such as the high level to an unselected level such as the low level. Then, the distal end WLB of the word line WL gradually transitions from a selection level such as the high level to an unselected level such as the low level. The potential level of the wiring L2B connected to the output terminal of the inverter circuit IV2 changes from a selection level such as the low level to a non-selection level such as the high level, the P-channel MOS field effect transistor P12 is turned off, and the N-channel MOS field effect transistor N12 is turned on. As a result, the potential level of the distal end WLB of the word line WL sharply drops (pull down) and rapidly transitions to an unselected level such as the low level. In FIG. 21, a waveform indicated by a dotted line Z12 indicates a potential change from the high level to the low level of the distal end WLB of the word line WL in the sixth modified example. As described above, in the seventh modified example, the potential change of the distal end WLB of the word line WL from the high level to the low level transitions faster than the waveform indicated by the dotted line Z12.

At time t5, the control signal TSNM is transitioned from an activation level such as the high level to a non activation level such as the low level. As a result, the potential level of the power supply potential generated by the power supply potential generating circuit VWL2 is returned to the first memory power supply potential VDDM1 by the word line power supply potential WVDDR2 at the time of reading.

According to the seventh modified example, since the potential level of the distal end WLB of the word line WL quickly transitions to an unselected level such as the low level, it is possible to speed up the read operation of the memory device 102 and the entire address access time in the write operation.

Figure 22:
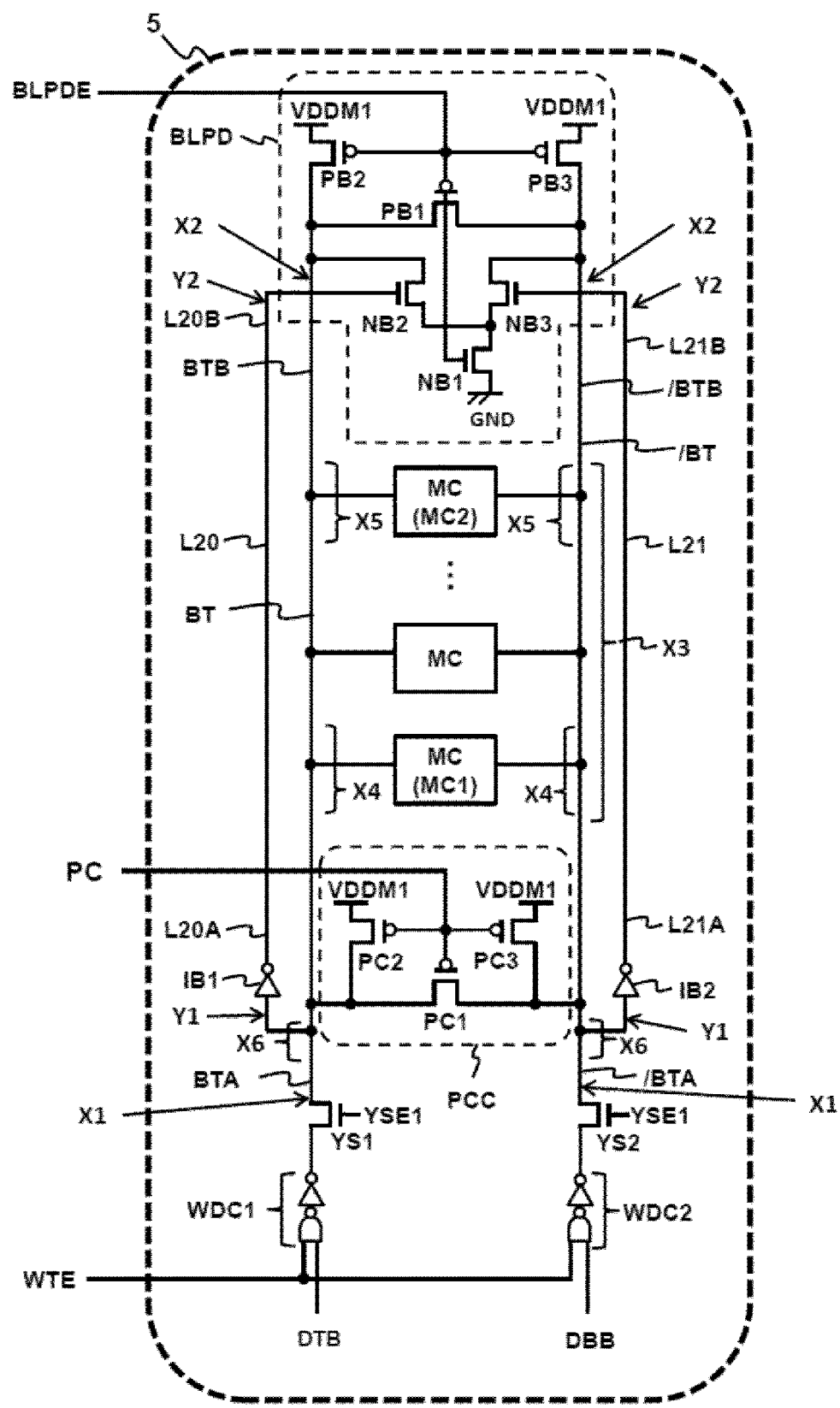
FIG. 22 is a diagram illustrating an exemplary configuration of a unit circuit according to the third embodiment.
Figure 23:
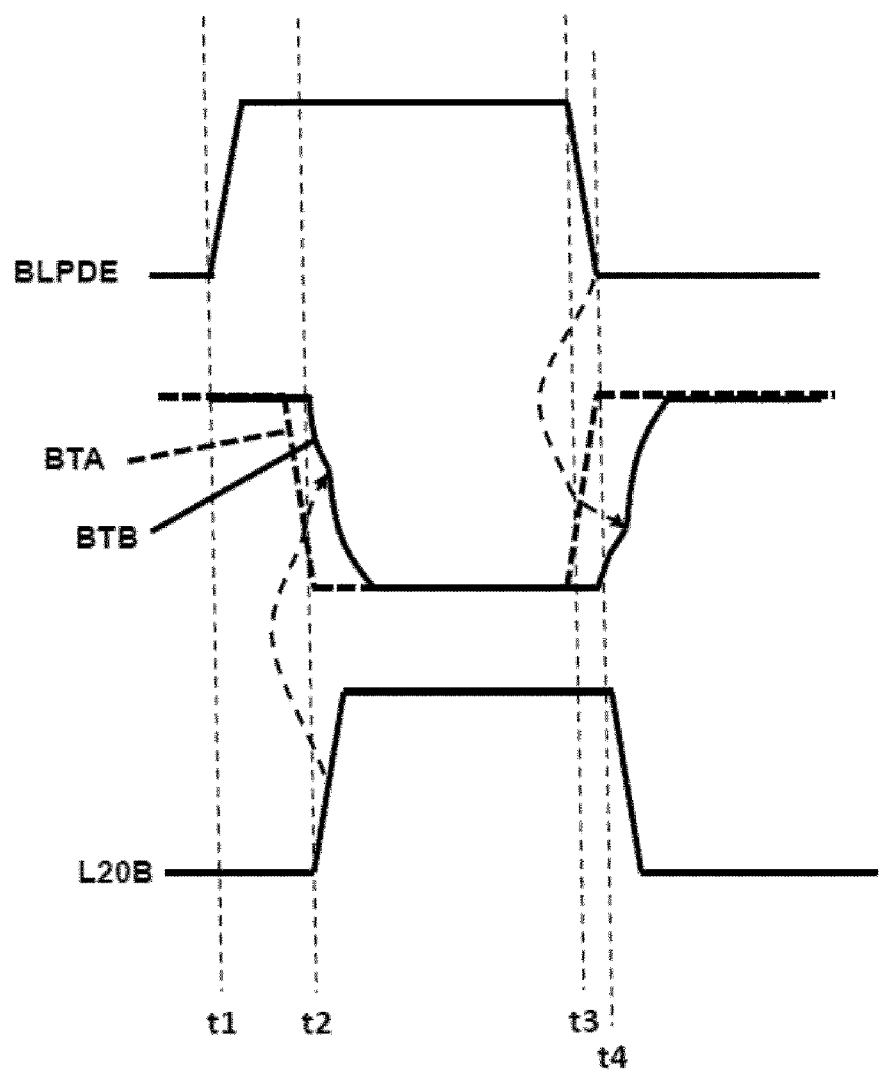
FIG. 23 is a diagram for explaining an operation of the unit circuit according to the third embodiment.

In the first embodiment, the second embodiment, and the first to seventh modified examples, the pull-up operation of the distal end of the word line WL has been described. In a third embodiment, an exemplary configuration to be applied to the bit line of the memory device 102 will be described. FIG. 22 is a diagram illustrating an exemplary configuration of the unit circuit 5 according to the third embodiment. FIG. 23 is a diagram for explaining the operation of the unit circuit 5 according to the third embodiment. The third embodiment can be used in conjunction with any one of the first embodiment, the second embodiment, and the first to seventh modified examples.

FIG. 22 shows a unit circuit 5 of the memory device 102 in the column direction. The unit circuit 5 includes two write driver circuits WDC1, WDC2, two column switches YS1, YS2, a pair of complementary bit lines BT, /BT, two wirings L20, L21, a plurality of memory cells MC, a bit line precharge circuit PCC, and a bit line potential control circuit BLPD. One bit line BT of the pair of complementary bit lines BT, /BT can be referred to as a first bit line, and the other bit line/BT of the pair of complementary bit lines BT, /BT can be referred to as a second bit line. It should be noted that in the unit circuit 5, the word line WL connected to each of the plurality of memory cells MC is not depicted for simplicity of illustration.

The plurality of memory cells MC can utilize the configuration of the memory cell MC shown in FIG. 4. In one memory cell MC, the source or drain of the access transistor NA1 is connected to the bit line BT, and the source or drain of the access transistor NA2 is connected to the bit line/BT.

Each column switch YS1, YS2 has a gate that receives its column select signal YSE1. The source-drain path of the column switch YS1 is connected between the bit line BT and the output terminal of the write driver circuit WDC1. The source-drain path of the column switch YS2 is connected between the bit line/BT and the output terminal of the write driver circuit WDC2. The column switch YS1, YS2 may be, in one instance, constituted by an N-channel MOS field effect transistor. Each of the column switch YS1, YS2 may be configured by a CMOS switch using an N-channel MOS field effect transistor and a P-channel MOS field effect transistor.

The write driver circuit WDC1, WDC2 receive the write data DTB, DBB, and the write enable signal WTE. Each of the write driver circuit WDC1 and WDC2 is controlled in its operation by the write enable signal WTE. When the write data DTB is at the high level and the write data DBB is at the low level, when the column switch YS1, YS2 are on state, the bit line BT is set to the high level, the bit line/BT is set to the low level, and the data "1" is written to the selected memory cell. When the write data DTB is the low level, the write data DBB is the high level, when the column switch YS1, YS2 are on state, the bit line BT is set to the low level, the bit line/BT is set to the high level, and the data "0" is written in the selected memory cell. In other words, the write driver circuit WDC1 changes the potential of the bit line BT by supplying a potential corresponding to the write data DTB to the bit line in accordance with the inputted write enable signal WTE. The write driver circuit WDC2 supplies a potential corresponding to the write data DBB to the bit line/BT in accordance with the write enable signal WTE, thereby changing the potential of the bit line/BT.

The bit line BT has a proximal end BTA and a distal end BTB when viewed from the output terminal side of the write driver circuit WDC1 or the column switch YS1 side. Similarly, the bit line/BT has a proximal end/BTA and a distal end/BTB when viewed from the output terminal side of the write driver circuit WDC2 or the column switch YS2 side.

The wiring L20 is a metal wiring provided in parallel with the bit line BT, and has a proximal end L20A and a distal end L20B. The proximal end BTA of the bit line BT is connected to the proximal end L20A of the wiring L20 via the inverter circuit IB1. The wiring L21 is a metal wiring provided in parallel with the bit line/BT, and has a proximal end L21A and a distal end L21B. The proximal end/BTA of the bit line/BT is connected to the proximal end L21A of the wiring L21 via the inverter circuit IB2.

The bit line precharge circuit PCC includes one equalization transistor PC1 and two precharge transistors PC2 and PC3. The transistors PC1, PC2, and PC3 may be formed of a P-channel MOS field effect transistor. The equalization transistor PC1 has a gate for receiving the precharge control signal PC and a source-drain path connected between the proximal end BTA of the bit line BT and the proximal end/BTA of the bit line/BT. The precharge transistor PC2 has a gate for receiving the precharge control signal PC and a source-drain path connected between the wiring supplied with the first memory power supply potential VDDM1 and the proximal end BTA of the bit line BT. The precharge transistor PC3 has a gate for receiving the precharge control signal PC and a source-drain path connected between the wiring supplied with the first memory power supply potential VDDM1 and the proximal end/BTA of the bit line/BT.

When the precharge control signal PC is turned into the high level, the transistors PC1, PC2, and PC3 are turned off. When the precharge control signal PC is turned into the low level, the transistors PC1, PC2, and PC3 are turned on. The equalization transistor PC1 of the on state connects the proximal end BTA of the bit line BT and the proximal end/BTA of the bit line/BT, and equalizes the potential difference between the proximal end BTA of the bit line BT and the proximal end/BTA of the bit line/BT. The potential of the proximal end BTA of the bit line BT and the potential of the proximal end/BTA of the bit line/BT are set to a predetermined precharge potential by the precharge transistor PC2 and the PC3 of the on state. As a result, the potential of the bit line BT and the potential of the bit line/BT are brought to a predetermined precharge potential from the proximal end (BTA, /BTA) side to the distal end (BTB, /BTB) side.

The bit line potential control circuit BLPD includes one equalization transistor PB1, two pull up transistors PB2, PB3, an enable transistor NB1, and two pull-down transistors NB2, NB3. The equalization transistor PB1 and the pull up transistor PB2, PB3 can also be regarded as a bit line pull up circuit for pulling up bit line BT, /BT. The enable transistor NB1 and the pull-down transistor NB2,NB3 can be regarded as a bit line pull down circuit for pulling down the bit line BT, /BT. The equalization transistor PB1, the pull up transistor PB2, PB3 may be configured by a P-channel MOS field effect transistor in an example. The enable transistor NB1 and the pull-down transistor NB2, NB3 may be formed of an N-channel MOS field effect transistor in an example.

The equalization transistor PB1 has a gate receiving a control signal BLPDE and a source-drain path connected between the distal end BTB of the bit line BT and the distal end BTB of the bit line/BT. The pull up transistor PB2 has a gate receiving the control signal BLPDE and a source-drain path connected between the wiring supplied with the first memory power supply potential VDDM1 and the distal end BTB of the bit line BT. The pull up transistor PB3 has a gate receiving the control signal BLPDE and a source-drain path connected between the wiring supplied with the first memory power supply potential VDDM1 and the distal end/BTB of the bit line/BT.

When the control signal BLPDE is the high level, the equalization transistor PB1, the pull up transistor PB2, and the PB3 are turned into off state. When the control signal BLPDE is low level, the equalization transistor PB1, the pull up transistor PB2, and the PB3 are turned into on state. The equalization transistor PB1 of the on state connects the distal end BTB of the bit line BT and the distal end/BTB of the bit line BT, and equalizes the potential difference between the distal end BTB of the bit line BT and the distal end/BTB of the bit line/BT. The potential of the distal end BTB of the bit line BT and the potential of the distal end/BTB of the bit line/BT are set to predetermined pull-up potential by the pull up transistor PB2 and PB3 of the on state. As a result, the potential of the bit line BT and the potential of the bit line/BT are brought to a predetermined pull-up potential from the distal end (BTB, /BTB) side to the proximal end (BTA, /BTA) side.

The enable transistor NB1 has a gate receiving the control signal BLPDE and a source-drain path connected to the ground potential GND. The pull-down transistor NB2 has a gate connected to the distal end L20B of the wiring L20, and a source-drain path provided between the distal end BTB of the bit line BT and the source-drain path of the enable transistor NB1. The source-drain path of the pull-down transistor NB2 and the source-drain path of the enable transistor NB1 are connected in series between the distal end BTB and the ground potential GND of the bit line BT. The pull-down transistor NB3 has a gate connected to the distal end L21B of the wiring L21, and a source-drain path provided between the distal end/BTB of the bit line/BT and the source-drain path of the enable transistor NB1. The source-drain path of the pull-down transistor NB3 and the source-drain path of the enable transistor NB1 are connected in series between the distal end BTB and the ground potential GND of the bit line BT.

The enable transistor NB1 is turned on by a high level of the control signal BLPDE. When writing the write data DTB of the low level to the selected memory cell, the column switch YS1, YS2 is turned on and the bit line BT transitions from the high level to the low level by the write driver circuit WDC1. In this instance, the potential level of the proximal end BTA of the bit line BT firstly transitions from the high level to the low level. The load capacity of the bit line BT is relatively large because a plurality of memory cells MC are connected. Therefore, the potential level of the distal end BTB of the bit line BT gradually drops from high level. On the other hand, the inverter circuit IB1 transitions the potential level of the proximal end L20A of the wiring L20 from the low level to the high level based on the transition from the high level to the low level of the proximal end BTA of the bit line BT. Since the load capacity of the wiring L20 is smaller than that of the bit line BT to which a plurality of memory cells MC are connected, the transition of the proximal end L20A of the wiring L20 from the low level to the high level is quickly transmitted to the distal end L20B of the wiring L20. As a result, the pull-down transistor NB2 changes from the off state to the on state, and the potential level of the distal end BTB of the bit line BT quickly changes to the low level. As a result, writing of data to the selected memory cell is speeded up. When writing the write data DTB of the high level, the bit line/BT transitions from the high level to the low level by the write driver circuit WDC2. Since it is considered that a skill in art can easily understand the following operation from the above description, the description thereof will be omitted.

Here, the bit line (BT, /BT) and the wiring (L20, L21) will be described. When the bit line (BT, /BT) is a first wiring, the wiring (L20, L21) can be regarded as a second wiring.

As shown in FIG. 22, the bit line (BT, /BT) includes a first portion X1, a second portion X2 different from the first portion X1, and a third portion X3 provided between the first portion X1 and the second portion X2 and different from the first portion X1 and the second portion X2. The first portion X1 is connected to the write driver circuit (WDC1, WDC2) via the column switch (YS1, YS2). The second portion X2 is connected to the drain of the pull-down transistor NB2, NB3 provided in the bit line potential control circuit BLPD. The third portion X3 is connected to the source or drain of the access transistor NA1, NA2 in a plurality of memory cells MC for one column provided in the memory cell array MCA. Thus, the third portion X3 can also be regarded as a memory cell connection area. The source or drain of the plurality of access transistors can be viewed as the load capacity to the bit line (BT, /BT).

When the bit line (BT, /BT) is viewed from the output terminal side of the write driver circuit (WDC1, WDC2) or the column switch (YS1, YS2) side, the first portion X1 can be viewed as the proximal end (BTA, /BTA) of the bit line (BT, /BT), and the second portion X2 can be viewed as the distal end (BTB, /BTB) of the bit line (BT, /BT).

The third portion X3 of the bit line (BT, /BT) further includes a fourth portion X4 located nearest to the first portion X1 and a fifth portion X5 located nearest to the second portion X2. The plurality of memory cells MC in one column include a first memory cell (MC1) having access transistors NA1 and NA2, the source or drain of which is connected to the fourth portion X4, and a second memory cell (MC2) having access transistors NA1 and NA2, the source or drain of which is connected to the fifth portion X5. The bit line (BT, /BT) further has a sixth portion X6 different from the first portion X1 and the fourth portion X4, and provided between the first portion X1 and the fourth portion X4.

As shown in FIG. 22, the wiring (L20, L21) has a first portion Y1 connected to the sixth portion X6 and a second portion Y2 different from the first portion Y1. The second portion Y2 is connected to the gate of a pull-down transistor NB2, NB3 in the bit line potential control circuit BLPD. When the bit line (BT, /BT) is viewed from the output terminal side of the write driver circuit (WDC1, WDC2) or the column switch (YS1, YS2) side, the first portion Y1 can be regarded as the proximal end of the wiring (L20, L21), and the second portion Y2 can be viewed as the distal end of the wiring (L20, L21). The wiring (L20, L21) can be configured by a metal wiring layer different from the bit line (BT, /BT). The wiring (L20, L21) can also be composed of metal wiring layer the same layer of as the bit line (BT, /BT). Since the number of transistors connected to the wiring (L20, L21) is small, the load capacity of the wiring (L20, L21) is smaller than the load capacity of the bit line (BT, /BT).

Next, transitions of a potential of the bit line BT during a writing will be described with reference to FIG. 23.

At time t1, the control signal BLPDE transitions from the low level to the high level. As a result, the enable transistor NB1 is turned on. The write driver circuit WDC1, WDC2 is activated by the write enable signal WTE, and the bit line precharge circuit PCC is deactivated by the precharge control signal PC. As a result, the proximal end BTA of the bit line BT sharply transitions to the low level based on the write data DTB. The distal end BTB of the bit line BT transitions slowly to the low level.

At time t2, since the load capacity of the wiring L20 is smaller than the load capacity of the bit line (BT, /BT), the distal end L20B of the wiring L20 transitions sharply from the low level to the high level. As a result, the pull-down transistor NB2 is turned on, so that the distal end BTB of the bit line BT quickly transitions to the low level.

At time t3, the control signal BLPDE transitions from the high level to the low level. The write driver circuit WDC1, WDC2 is deactivated by the write enable signal WTE, and the bit line precharge circuit PCC is activated by the precharge control signal PC. As a result, the proximal end BTA of the bit line BT transitions sharply from the low level to the high level. The distal end BTB of the bit line BT transitions slowly to the high level.

At time t4, since the equalization transistor PB1 and the pull up transistor PB2, PB3 in the bit line potential control circuit BLPD are set to on state based on the low level of the control signal BLPDE, the distal end BTB of the bit line BT quickly transitions to the high level.

According to third embodiment, since the bit line potential control circuit BLPD is provided in the distal end (BTB, /BTB) of the bit line (BT, /BT) and the pull-down transistor (NB2,NB3) in the bit line potential control circuit BLPD is controlled by the wiring (L20, L21) having a small load capacity, it is possible to speed up the transitioning of the potential level in the distal end of the bit line. Therefore, the address access time of the memory device 102 in the write operation can be speeded up, and the read operation of the memory device 102 and the entire address access time in the write operation can be speeded up.

Eighth Modified Example

Figure 24:
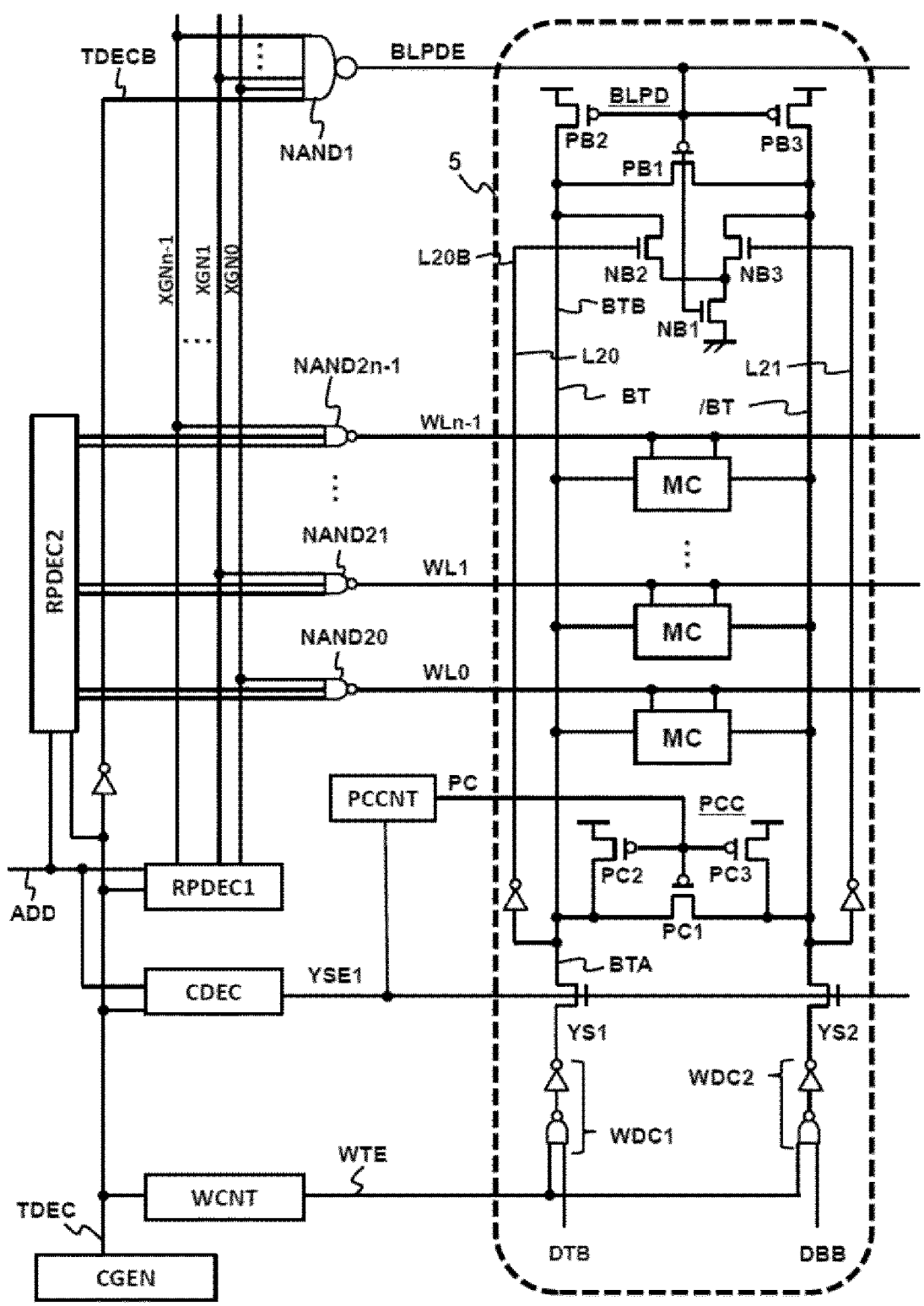
FIG. 24 is a diagram illustrating an exemplary configuration of a memory device according to an eighth modified example.
Figure 25:
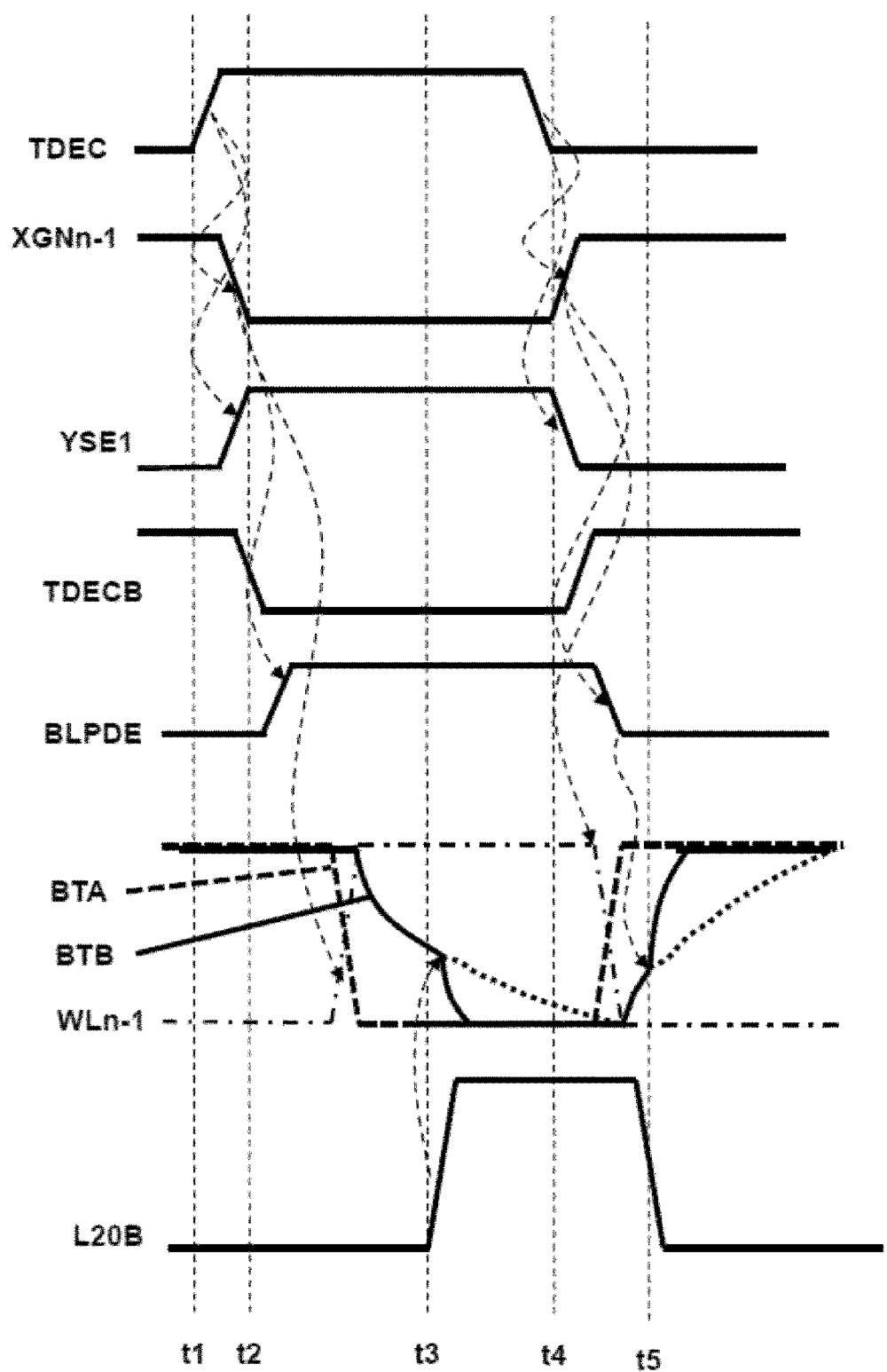
FIG. 25 is a diagram for explaining the operation of the memory device according to the eighth modified example.

Next, an eighth modified example will be described. The eighth modified example describes a signal generation circuit, a row predecoder, a column decoder such as a control signal (BLPDE, PC, WTE) inputted to the unit circuit 5 of the third embodiment. In the eighth modified example, the same sign is attached to a configuration having the same function as the third embodiment, and descriptions thereof are omitted. FIG. 24 is a diagram illustrating an exemplary configuration of the memory device 102 according to the eighth modified example. FIG. 25 is a diagram for explaining the operation of the memory device 102 according to the eighth modified example. In FIG. 24, the configuration of the unit circuit 5 is the same as the configuration of the unit circuit 5 in FIG. 22, and therefore the explanation thereof is omitted. In unit circuit 5 of FIG. 24, only the main sign of the sign used in the unit circuit 5 of FIG. 22 is extracted and described for the sake of simplification of the drawing.

Referring to FIG. 24, address signal ADD includes a row address signal and a column address signal. The row address signals is supplied to the row predecoder RPDEC1 and the row predecoder RPDEC2. The column address signal is supplied to the column decoder CDEC.

An internal clock signal generation circuit CGEN generates an internal clock pulse TDEC. The internal clock pulse TDEC is supplied to the row predecoders RPDEC1, PDEC2 and the column decoder CDEC and controls the operation of the row predecoders RPDEC1, PDEC2, and the column decoder CDEC.

NAND circuits NAND20 to 2n-1 have a role of a row main decoder and a word line driver circuit (WLD). Input terminals of NAND circuits NAND 20 to 2n-1 are connected to outputs of row predecoders RPDEC1, PDEC2. Row select signals XGN0 to XGNn-1 outputted from the row predecoder RPDEC 1 are connected to the input terminals of the NAND circuits NAND20 to 2n-1, respectively. The output terminals of the NAND circuits NAND20 to 2n-1 are connected to the word lines WL0 to WLn-1 to which the plurality of memory cells MC are connected, respectively.

The column select signal YSE1 outputted from the column decoder CDEC is supplied to the gate of the column switch YS1, YS2. In FIG. 24, only the column select signal YSE1 is depicted, and other column select signal outputted from the column decoder CDEC is not described.

The precharge control circuit PCCNT generates a precharge control signal PC based on the column select signal YSE1, and supplies the generated precharge control signal PC to each gate of each of the equalization transistor PC1, the precharge transistor PC2, PC3 in the bit line precharge circuit PCC.

The write control circuit WONT receives the internal clock pulse TDEC generated by the internal clock signal generation circuit CGEN, generates a write enable signal WTE, and supplies the generated TDEC to the write driver circuit WDC1, WDC2.

A NAND circuit NAND2 receives an inverted internal clock pulse TDECB obtained by inverting the internal clock pulse TDEC and a row select signal XGN0 to XGNn-1 outputted from the row predecoder RPDEC1, and generates a control signal BLPDE. The generated control signal BLPDEs are supplied to the bit line potential control circuit BLPD.

Next, the operation of the memory device 102 will be described with reference to FIG. 25.

At time t1, the internal clock pulse TDEC transitions from the low level to the high level and the inverted internal clock pulse TDECB transitions from the high level to the low level. Transition of the internal clock pulse TDEC to high level causes the row select signal XGNn-1 to transition from the high level to the low level and the column select signal YSE1 to transition from the low level to the high level.

At time t2, the transition of the row select signal XGNn-1 to the low level causes the control signal BLPDE to transition from the low level to the high level, which causes the enable transistor NB1 to be on state. Also, the word line WLn-1 transitions from the low level to the high level, the proximal end BTA of bit line BT transitions quickly from the high level to the low level, and the distal end BTB of bit line BT transitions slowly to the low level.

At time t3, since the load capacity of the wiring L20 is smaller than the load capacity of the bit line (BT, /BT), the distal end L20B of the wiring L20 transitions sharply from the low level to the high level. As a result, the pull-down transistor NB2 is turned on, so that the distal end BTB of the bit line BT quickly transitions to the low level.

At time t4, the internal clock pulse TDEC transitions from the high level to the low level and the inverted internal clock pulse TDECB transitions from the low level to the high level. Transition of the internal clock pulse TDEC to low level causes row select signal XGNn-1 to transition from the low level to the high level and column select signal YSE1 to transition from the high level to the low level. The transition of the row select signal XGNn-1 to the high level causes the control signal BLPDE to transition from the high level to the low level, thereby turning off the enable transistor NB1. Also, the word line WLn-1 transitions from the high level to the low level, the proximal end BTA of bit line BT transitions quickly from the low level to the high level, and the distal end BTB of the bit line BT transitions slowly to the high level.

At time t5, since the equalization transistor PB1 and the pull up transistor PB2, PB3 in the bit line potential control circuit BLPD are set to on state based on the low level of the control signal BLPDE, the distal end BTB of the bit line BT quickly transitions to the high level. Since the load capacity of the wiring L20 is smaller than the load capacity of the bit line (BT, /BT), the distal end L20B of the wiring L20 sharply transitions from the high level to the low level.

According to the eighth modified example, the control signal BLPDE is generated using pulses of the internal clock pulse TDEC and the row select signals XGN1 to n-1 generated from the internal clock pulse TDEC and the address signal ADD. The period of the high level (selection level) of the word line WL1 to n-1 and the period of the low level of the bit line BT may be shifted depending on a finish, temperatures, and voltages of a plurality of transistors constituting the memory device 102. However, since the row select signal XGN1 to n-1 determine the pulse width of the high level period of the word line WL1 to n-1, the bit line BT is not pulled up during the period in which the word line WL1 to n-1 are the high level, and the period in which the bit line BT is the low level is ensured.

Figure 26:
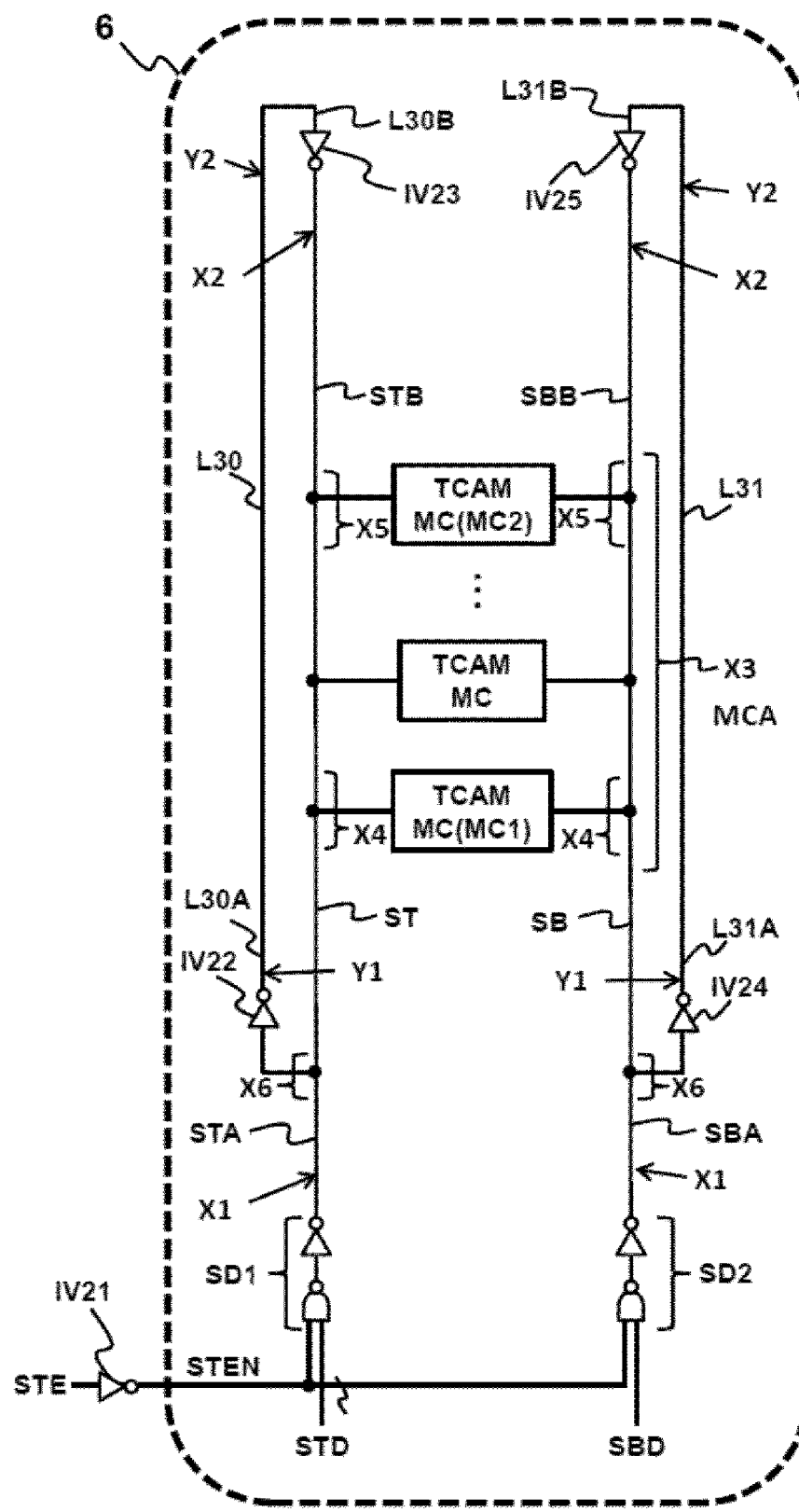
FIG. 26 is a diagram illustrating an exemplary configuration of a unit circuit of the TCAM according to the fourth embodiment.
Figure 27:
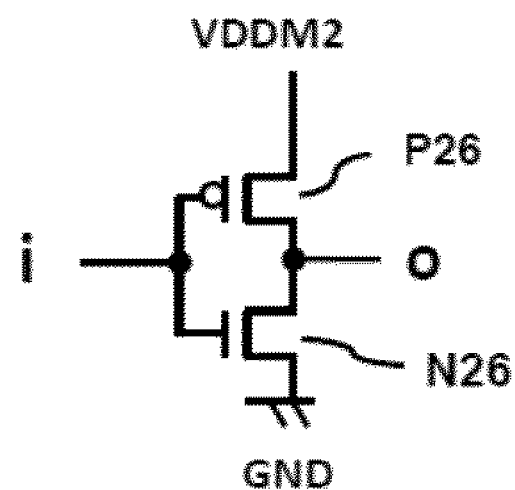
FIG. 27 is a diagram for explaining a configuration of the inverter circuit.
Figure 28:
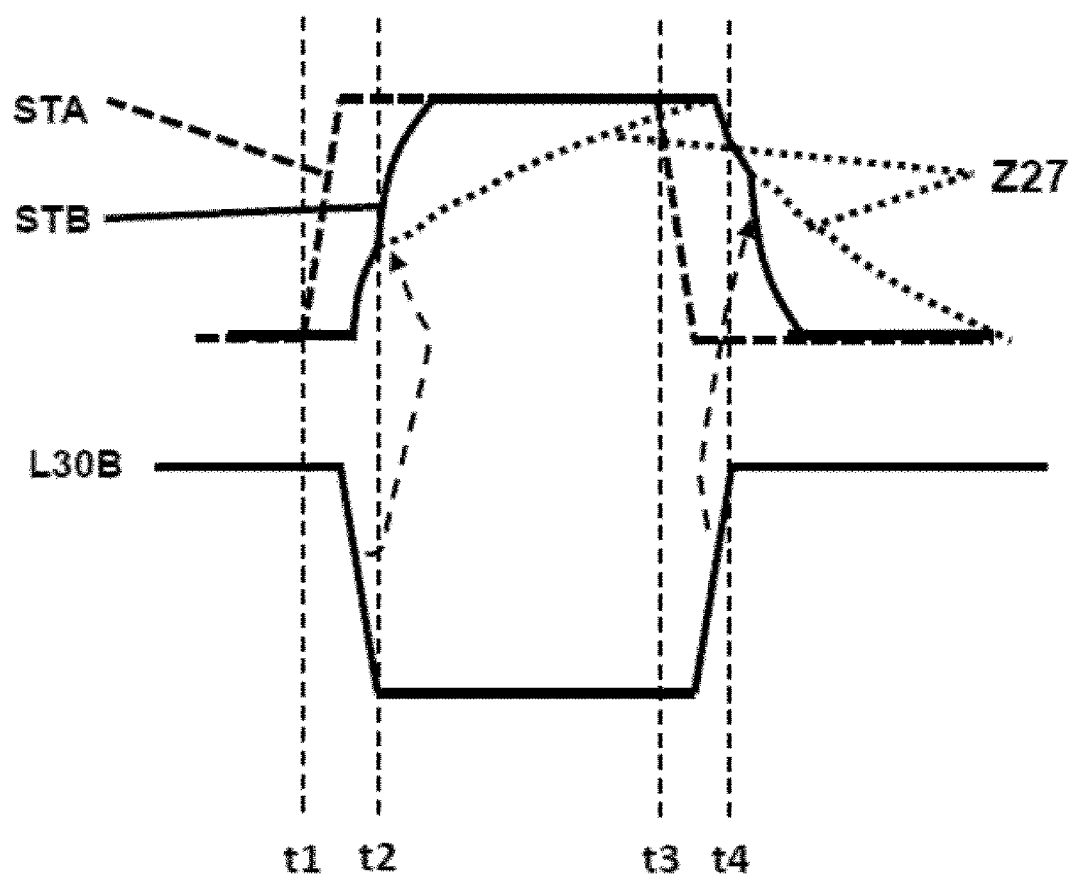
FIG. 28 is a diagram for explaining the operation of the unit circuit according to the fourth embodiment.

A fourth embodiment shows an exemplary configuration applied to a search line of a TCAM. FIG. 26 is a diagram showing an exemplary configuration of the unit circuit 6 of the TCAM according to the fourth embodiment. FIG. 27 is a diagram illustrating a configuration of an inverter circuit (IV23, IV25). FIG. 28 is a diagram for explaining a searching operation of the unit circuit 6 according to the fourth embodiment.

TCAM (Ternary Content Addressable Memory) is a content reference memory, and each of a plurality of memory cells TCAMMC of the TCAM can store information of "don't care (Don't Care)" in addition to information of "0" and "1". "Don't care" indicates that both "0" and "1" can be used. In the TCAM, search data (STD, SBD) is inputted to a search line pair ST, SB, and the data to be stored is compared with the search data (STD, SBD) in the respective memory cell TCAMMC. When the search data (STD, SBD) and the storage data coincide with each other, a coincidence result is outputted to the match line. In FIG. 26, a configuration including search line pair ST and SB of the TCAM is shown as unit circuit 6. One search line ST of the search line pair ST, SB may be referred to as a first search line, and the other search line SB of the search line pair ST, SB may be referred to as a second search line.

The unit circuit 6 includes search line driver circuits SD1, SD2, a search line pair ST, SB, a plurality of memory cells TCAMMC, and wirings L30, L31. When the search line (ST, SB) is a first wiring, the wiring (L30, L31) can be regarded as a second wiring.

Figure 29:
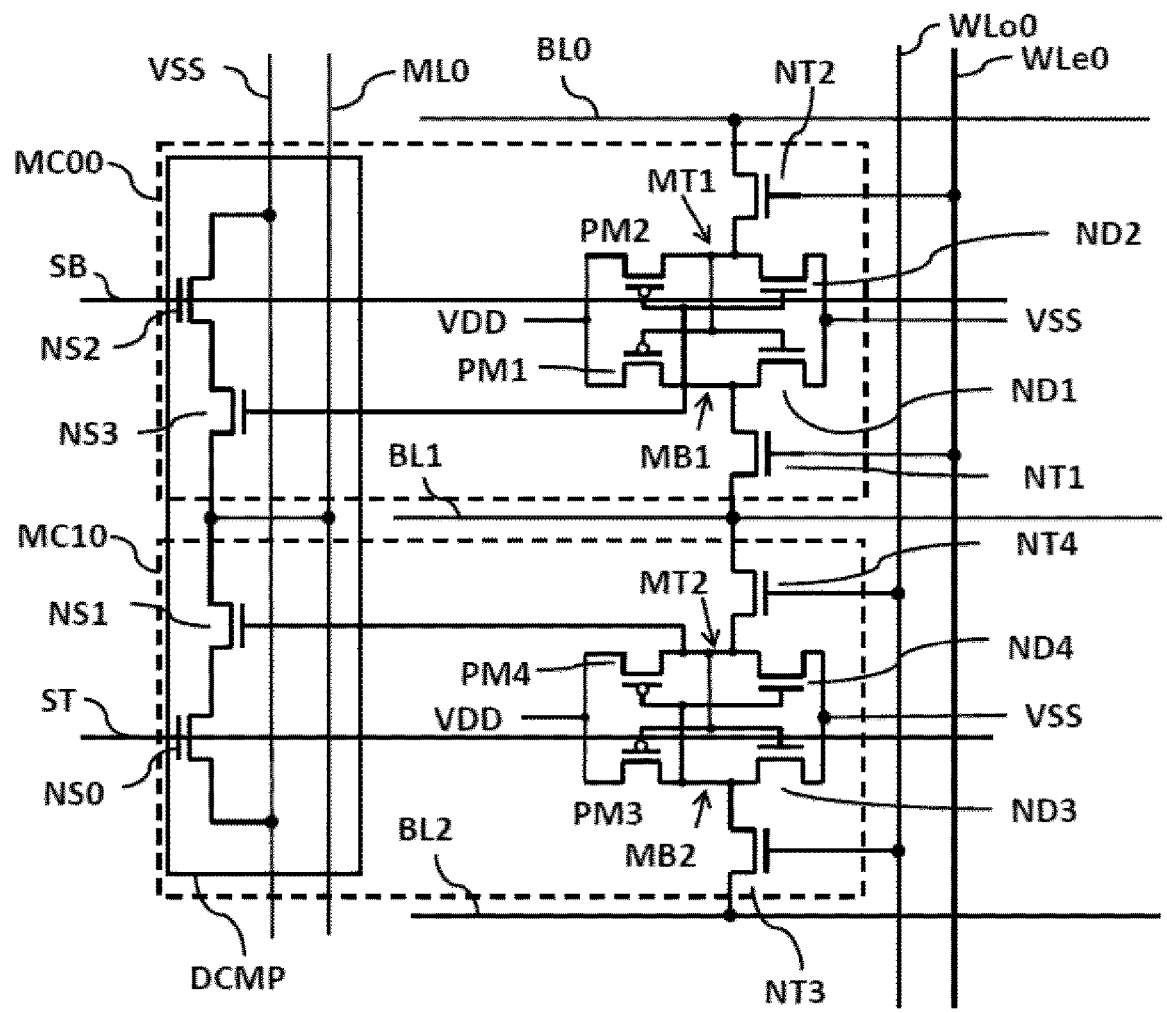
FIG. 29 is a diagram showing an exemplary configuration of the memory cell TCAMMC.

First, an exemplary configuration of the memory cell TCAMMC will be described with reference to FIG. 29. As shown in FIG. 29, each of the plurality of memory cells TCAMMC of the TCAM includes memory cell MC00, MC10, and a data comparison circuit DCMP. Each memory cell MC00, MC10 is a single port memory cell (6T SP SRAM cell) containing six MOS transistors.

The memory cell MC00 includes first and second P-channel MOS transistors PM1, PM2, and first to fourth N-channel MOS transistors NT1, NT2, ND1, ND2. The source-drain paths of the P-channel MOS transistors PM1 and PM2, which are first and second load transistors, are connected between a supply line of a power supply voltage VDD and first and second storage nodes MB1, MT1, respectively, and their gates are connected to the second and first storage nodes MT1, MB1, respectively. The source-drain paths of the N-channel MOS transistor ND1, ND2, which are the first and second drive transistors, are connected between the first and second storage node MB1, MT1 and a supply line of a ground potential VSS, respectively, and their gates are connected to the second and first storage nodes MT1, MB1, respectively. The source-drain paths of the N-channel MOS transistors NT1 and NT2 serving as the first and second transfer transistors are connected between the first and second storage nodes MB1, MT1 and the bit lines BL1, BL0, respectively, and their gates are both connected to the word line WLe0. The MOS transistors PM1, ND1 constitute a first inverter which provide an inverted signal of the signal of the second storage node MT1 to the first storage node MB1. The MOS transistors PM2, ND2 constitute a second inverter for providing an inverted signal of the signal of the first storage node MB1 to the second storage node MT1. The inputs and outputs of the two inverters are connected in anti-parallel between the first and second storage nodes MB1, MT1 and constitute a latch circuit.

The memory cell MC 10 includes first and second P-channel MOS transistors PM3, PM4, and first to fourth N-channel MOS transistors NT3, NT4, ND3, and ND4. The source-drain paths of the P-channel MOS transistors PM4, PM4, which are the first and second load transistors, are connected between the supply lines of the power supply voltage VDD and the first and second storage nodes MB2, MT2, respectively, and their gates are connected to the second and first storage nodes MT2, MB2, respectively. The source-drain paths of the N-channel MOS transistors ND3, ND4, which are first and second drive transistors, are connected between the first and second storage nodes MB2, MT2 and the supply line of the ground potential VSS, respectively, and their gates are connected to the second and first storage nodes MT2, MB2, respectively. The source-drain paths of the N-channel MOS transistors NT3, NT4 serving as the first and second transfer transistors are connected between the first and second storage nodes MB2, MT2 and the bit lines BL2, BL1, respectively, and their gates are both connected to the word line WLo0.

The MOS transistors PM3, ND3 constitute a first inverters for providing an inverted signal of the signal of the second storage node MT2 to the first storage node MB2. The MOS transistors PM4, ND4 constitute a second inverter for providing the inverted signal of the signal of the first storage node MB2 to the second storage node MT2. The inputs and outputs of the two inverters are connected in anti-parallel between the first and second storage nodes MB2, MT2 and constitute a latch circuit.

The data comparison circuit DCMP includes four N-channel MOS transistors (NS0-NS3). The source-drain path of the N-channel MOS transistor NS0 and the source-drain path of the N-channel MOS transistor NS1 are connected in series between the match line ML0 and the supply line of the ground potential VSS. The gate of the N-channel MOS transistor NS0 is connected to one search line (search line ST) of the search line pair (ST, SB). The gate of the N-channel MOS transistor NS1 is connected to a first storage node MT2 of the memory cell MC10. The source-drain path of the N-channel MOS transistor NS2 and the source-drain path of the N-channel MOS transistor NS3 are connected in series between the match line ML0 and the supply line of the ground potential VSS. The gate of the N-channel MOS transistor NS2 is connected to the other search line (search line SB) of the search line pair (ST, SB).

The gate of the N-channel MOS transistor NS3 is connected to the second storage node MB1 of the memory cell MC00.

One TCAM cell TCEL can store three values of "0", "1" and "*" (don't care) as TCAM data using a 2-bit SRAM cells. For example, when "0" is stored in the storage node MB1 of the MC00 and "1" is stored in the storage node MT2 of the MC10, it is assumed that "0" is stored in the TCAM cell TCEL. When "1" is stored in the storage node MB1 of the MC00 and "0" is stored in the storage node MT2 of the MC10, it is assumed that "1" is stored in the TCAM cell TCEL. When "0" is stored in the storage node MB1 of the MC00 and "0" is stored in the storage node MT2 of the MC10, it is assumed that "*" (don't care) is stored in the TCAM cell TCEL. A case is not used in which "1" is stored in the storage node MB1 of the MC00 and "1" is stored in the storage node MT2 of the MC10.

When search data is "1" (i.e., search line ST is "1" and search line SB is "0") and TCAM data is "0" (storage node MB1 is "0" and storage node MT2 is "1"), MOS transistors NS0 and NS1 become on state, so that the precharged potential of the match line ML is pulled down to the ground potential.

When search data is "0" (i.e., search line ST is "0" and search line SB is "1") and TCAM data is "1" (storage node MB1 is "1" and storage node MT2 is "0"), MOS transistors NS2 and NS3 become on state, so that the precharged potential of the match line ML is pulled down to the ground potential. That is, when the search data and the TCAM data do not coincide with each other, the potential of the match line ML is pulled down to the ground potential.

Conversely, when the inputted search data is "1" and the TCAM data is "1" or "*", or when the search data is "0" and the TCAM data is "0" or "*" (i.e., when both coincide with each other), the precharged potential (power supply potential VDD-level) of the match line ML is maintained.

As shown in FIG. 26, the search line ST includes a first portion X1, a second portion X2 different from the first portion X1, and a third portion X3 provided between the first portion X1 and the second portion X2 and different from the first portion X1 and the second portion X2. The first portion X1 of the search line ST is connected to the output terminal of the search line driver circuit SD1. The second portion X2 of the search line ST is connected to the drain of the pull-down transistor N26 (refer to FIG. 27) and the pull up transistor P26 (see FIG. 27) provided in the inverter circuit IV23. The third portion X3 of the search line ST is connected to the gates of the plurality of transistors NS0 in the data comparison circuit DCMP in the plurality of memory cells TCAMMC for one column provided in the memory cell array MCA. Thus, the third portion X3 of the search line ST can also be regarded as a memory cell connection area. The gate of the plurality of transistors NS0 can be regarded as a load capacity to the search line ST. When viewed from the output terminal side of the search line driver circuit SD1, the first portion X1 of the search line ST can be regarded as the proximal end STA of the search line ST, and the second portion X2 of the search line ST can be regarded as the distal end STB of the search line ST.

As shown in FIG. 26, the search line SB includes a first portion X1, a second portion X2 different from the first portion X1, and a third portion X3 provided between the first portion X1 and the second portion X2 and different from the first portion X1 and the second portion X2. The first portion X1 of the search line SB is connected to the output terminal of the search line driver circuit SD2. The second portion X2 of the search line SB is connected to the drain of the pull-down transistor N26 (refer to FIG. 27) and the pull up transistor P26 (see FIG. 27) provided in the inverter circuit IV25. The third portion X3 of the search line SB is connected to the gate of the plurality of transistors NS2 in the data comparison circuit DCMP in the plurality of memory cells TCAMMC for one column provided in the memory cell array MCA. Thus, the third portion X3 of the search line SB can also be regarded as a memory cell connection area. The gate of the plurality of transistors NS2 can be viewed as a load capacity to the search line SB. When viewed from the output terminal of the search line driver circuit SD2, the first portion X1 of the search line SB can be viewed as the proximal end SBA of the search line SB, and the second portion X2 of the search line SB can be viewed as the distal end SBB of the search line SB.

The third portion X3 of the search line (ST, SB) further includes a fourth portion X4 located nearest to the first portion X1 and a fifth portion X5 located nearest to the second portion X2. The plurality of TCAM memory cells TCAMMC for one column include a first memory cell (MC1) having transistors NS0, NS2 whose gate are connected to the fourth portion X4, and a second memory cell (MC2) having transistors NS0,NS2 whose gate are connected to the fifth portion X5. The search line (ST, SB) further comprises a sixth portion X6 different from the first portion X1 and the fourth portion X4 and provided between the first portion X1 and the fourth portion X4.

The search line driver circuits SD1 and SD2 are connected to the output terminal of the inverter circuit IV21 which receives the search enable signal STE at its input terminal and outputs the inverted signal STEN of the search enable signal STE from the output terminal. The search line driver circuits SD1 and SD2 are controlled by the inverted signal STEN of the search enable signal STE. The search line driver circuit SD1 is adapted to receive a search data STD, and an output of the search line driver circuit SD1 is connected to the proximal end STA of the search line ST. The search line driver circuit SD2 is adapted to receive a search data SBD, and an output of the search line driver circuit SD2 is connected to the proximal end SBA of the search line SB. That is, the search line ST has the proximal end STA and the distal end STB when viewed from the output of the search line driver circuit SD1. When viewed from the output of the search line driver circuit SD2, the search line SB has a proximal end SBA and a distal end SBB. The search line driver circuit SD1 changes the potential of the search line ST by supplying a potential corresponding to the search data STD to the search line ST in accordance with the inverted signal STEN of the search enable signal STE. The search line driver circuit SD2 supplies a potential corresponding to the search data SBD to the search line SB in accordance with the inverted signal STEN of the search enable signal STE, thereby changing the potential of the search line SB. The search enable signal STE may be inputted to the search line drivers SD1,SD2 without passing through the inverter circuit IV21.

A plurality of memory cells TCAMMC are connected between the search line ST and the search line SB between the proximal end STA, SBA and the distal end STB, SBB.

The wiring L30 is a metal wiring provided in parallel with the search line ST, and has a first portion Y1 and a second portion Y2 that differs from the first portion Y1. The first portion Y1 of the wiring L30 is connected to the output terminal of the inverter circuit IV22. The input terminal of the inverter circuit IV22 is connected to the sixth portion X6 of the search line ST. The second portion Y2 of the wiring L30 is connected to the input terminal of the inverter circuit IV23. The output terminal of the inverter IV23 is connected to the second portion X2 of the search line ST. When viewed from the search line driver circuit SD1, the first portion Y1 of the wiring L30 can be viewed as the proximal end L30A of the wiring L30, and the second portion Y2 of the wiring L30 can be viewed as the distal end L30B of the wiring L30. The load capacity of the wiring L30 is smaller than the load capacity of search line ST to which a plurality of memory cells TCAMMC are connected.

The wiring L31 is a metal wiring provided in parallel with the search line SB, and comprises a first portion Y1 and a second portion Y2 different from the first portion Y1. The first portion Y1 of the wiring L31 is connected to the output terminal of the inverter circuit IV24. The input terminal of the inverter circuit IV24 is connected to the sixth portion X6 of the search line SB. The second portion Y2 of the wiring L31 is connected to the input terminal of the inverter circuit IV25. The output terminal of the inverter IV25 is connected to the second portion X2 of the search line SB. When viewed from the search line driver circuit SD2 side, the first portion Y1 of the wiring L31 can be viewed as the proximal end L31A of the wiring L31, and the second portion Y2 of the wiring L31 can be viewed as the distal end L31B of the wiring L31. The load capacity of the wiring L31 is smaller than the load capacity of the search line SB to which a plurality of memory cells TCAMMC are connected.

As shown in FIG. 27, each of the inverter circuits IV23 and IV25 includes a P-channel MOS field effect transistor P26 which is a pull up transistor and a N-channel MOS field effect transistor N26 which is a pull-down transistor. The P-channel MOS field effect transistor P26 has a gate connected to an input i, a source connected to the memory power supply potential VDDM2, and a drain connected to an output o. The N-channel MOS field effect transistor N 26 has a gate connected to an input i, a source connected to the ground potential GND, and a drain connected to an output o. For the inverter circuit IV23, the input i is connected to the distal end L30B of the wiring L30 and the output o is connected to the distal end STB of the search line ST. For the inverter circuit IV25, the input i is connected to the distal end L31B of the wiring L31, and the output o is connected to the distal end SBB of the search line SB.

In FIG. 26, when the search line ST transitions from the low level to the high level based on the search data STD, and the potential level of the proximal end STA of the search line ST transitions quickly from the low level to the high level. Since the load capacity of the search line ST is large, the potential level of the distal end STB of the search line ST gradually rises from the low level to the high level. On the other hand, since the load capacity of the wiring L30 is low, the potential level of the distal end L30B of the wiring L30 rapidly transitions from the high level to the low level. Therefore, the output of the inverter circuit IV23 is quickly shifted from the low level to the high level, and the potential level of the distal end STB of the search line ST is quickly shifted to the high level. The search line SB transitions from the high level to the low level, which will be easily understood by those skilled in the art from the above description, and a description thereof will be omitted.

Next, the operation of the search line ST unit circuit 6 will be described with reference to FIG. 28. In FIG. 28, the search line ST transitions from the low level to the high level based on the search data STD. In FIG. 28, a waveform indicated by a dotted line Z27 indicates a waveform in which the wiring L30, the inverter circuit IV22, and the IV23 are not provided.

At time t1, when the search enable signal STE is turned activation level and the search data STD is inputted, the proximal end STA of the search line ST quickly transitions from the low level to the high level based on the search data STD. Since the load capacity of the search line ST is large, the potential level of the distal end STB of the search line ST gradually rises from the low level to the high level. On the other hand, since the load capacity of the wiring L30 is low, the potential level of the distal end L30B of the wiring L30 rapidly transitions from the high level to the low level.

At time t2, based on the low level of the distal end L30B of the wiring L30, the output of the inverter circuit IV23 quickly transitions from the low level to the high level, and the potential level of the distal end STB of the search line ST quickly transitions to the high level.

At time t3, when the search enable signal STE is deactivated, the proximal end STA of the search line ST quickly transitions from the high level to the low level. As a result, the potential level of the distal end STB of the search line ST gradually drops from the high level to the low level. On the other hand, the potential level of the distal end L30B of the wiring L30 rapidly transitions from the low level to the high level.

At time t4, based on the high level of the distal end L30B of the wiring L30, the output of the inverter circuit IV23 quickly transitions from the high level to the low level, and the potential level of the distal end STB of the search line ST quickly transitions to the low level.

According to the fourth embodiment, since the speed of rising and falling of the potential level of the distal end STB of the search line ST can be increased, the individual search period of the TCAM can be shortened, and the entire search operation of the TCAM can be made fast.

While the invention made by the present inventor has been specifically described above based on the Embodiment, the present invention is not limited to the above-described embodiment and Embodiment, and it is needless to say that the present invention can be variously modified.

What is claimed is:
1. A semiconductor device comprising:
a first wiring including a first portion, a second portion different from the first portion, and a third portion different from the first and second portions and located between the first portion and the second portion;
a driver circuit including an input terminal, and an output terminal connected to the first portion;
a plurality of memory cells connected to the third portion;
a field effect transistor having a drain connected to the second portion and a gate;
a second wiring located in parallel with the first wiring, and electrically connected between the output terminal of the driver circuit and the gate of the field effect transistor; and
a potential generation circuit generating a first power supply potential,
wherein the first wiring is comprised of a word line,
wherein the plurality of memory cells are supplied with a second power supply potential,
wherein the potential generation circuit generates the first power supply potential lower than the second power supply potential in a read operation of the plurality of memory cells,
wherein the driver circuit is supplied with the first power supply potential and drives the first wiring and the second wiring such that the second portion of the word line if pulled up by turning on the field effect transistor based on a potential level of the driven second wiring.

2. The semiconductor device according to claim 1,
wherein the field effect transistor is comprised of a pull up transistor, and
wherein a source of the field effect transistor is connected to a power supply potential.

3. The semiconductor device according to claim 1,
wherein the field effect transistor is comprised of a pull down transistor, and
wherein a source of the field effect transistor is electrically connected to a ground potential.

4. The semiconductor device according to claim 1, wherein the first wiring and the second wiring are formed of a metal wiring layer of the same layer.

5. The semiconductor device according to claim 1,
wherein the first wiring is formed of a first metal wiring layer, and
wherein the second wiring is formed of a second metal wiring layer different from the first metal wiring layer.

6. A semiconductor device comprising:
a first wiring including a first portion, a second portion different from the first portion, and a third portion located between the first portion and the second portion;
a driver circuit including i) an input terminal and ii) an output terminal connected to the first portion;
a plurality of memory cells connected to the third portion;
a field effect transistor having i) a drain connected to the second portion and ii) a gate;
a second wiring located in parallel with the first wiring; and
a third wiring connected to the input terminal of the driver circuit,
wherein the second wiring is electrically connected between the third wiring and the gate of the field effect transistor,
wherein the semiconductor device further comprises:
a fourth wiring connected to the gate of the field effect transistor;
a first inverter circuit including i) an input connected to the third wiring and ii) an output; and
a second inverter circuit including an input and an output connected to the fourth wiring,
wherein the field effect transistor is comprised of a first p-channel field effect transistor, and
wherein the second wiring connects the output of the first inverter circuit and the input of the second inverter circuit.

7. The semiconductor device according to claim 6, further including a potential generation circuit generating a first power supply potential,
wherein the first wiring is comprised of a word line,
wherein the plurality of memory cells are supplied with a second power supply potential,
wherein the driver circuit is supplied with the first power supply potential and drives the word line based on the first power supply potential, and
wherein the potential generation circuit generates the first power supply potential lower than the second power supply potential in a read operation of the plurality of memory cells.

8. The semiconductor device according to claim 6, further comprising a potential generation circuit generating a first power supply potential,
wherein the first wiring is comprised of a word line,
wherein the plurality of memory cells are supplied with a second power supply potential,
wherein the driver circuit is supplied with the first power supply potential and drives the word line based on the first power supply potential, and
wherein the potential generation circuit generates the first power supply potential lower than the second power supply potential in a read operation of the plurality of memory cells.

9. The semiconductor device according to claim 6, further comprising a potential generation circuit,
wherein the first wiring is comprised of a word line,
wherein the driver circuit includes a second p-channel field effect transistor, a first n-channel field effect transistor, a third p-channel field effect transistor,
wherein the second p-channel field effect transistor includes a gate connected to the input terminal of the driver circuit, a drain connected to the output terminal of the driver circuit, and a source connected to a power supply potential,
wherein the first n-channel field effect transistor includes a gate connected to the input terminal of the driver circuit, a drain connected to the output terminal of the driver circuit, and a source connected to a ground potential,
wherein the third p-channel field effect transistor includes a gate connected to the input terminal of the driver circuit, a source connected to the output terminal of the driver circuit, and a drain connected to the ground potential,
wherein the source of the first p-channel field effect transistor is configured to receive a first power supply potential generated by the potential generation circuit,
wherein the plurality of memory cells are supplied with a second power supply potential, and
wherein the potential generation circuit generates the first power supply potential lower than the second power supply potential in a read operation of the plurality of memory cells.

10. The semiconductor device according to claim 9, further comprising a second n-channel field effect transistor having a gate and a source-drain path,
wherein the gate of the second n-channel field effect transistor is connected to the gate of the first p-channel field effect transistor, and
wherein the source-drain path of the second n-channel field effect transistor is connected between the word line and the ground potential.

11. A method for driving a semiconductor device,
wherein the semiconductor device comprises:
a first wiring including a first portion, a second portion different from the first portion, and a third portion located between the first portion and the second portion;
a driver circuit including an input terminal, and an output terminal connected to the first portion;
a plurality of memory cells connected to the third portion;
a field effect transistor having a drain connected to the second portion and a gate; and
a second wiring located in parallel with the first wiring, and electrically connected between the output terminal of the driver circuit and the gate of the field effect transistor,
wherein the method comprises:
driving the first wiring and the second wiring by the driver circuit, turning on the field effect transistor based on a potential level of the driven second wiring, and
pulling-up or pulling-down the second portion,
wherein the first wiring is comprised of a word line,
wherein the semiconductor device includes a potential generation circuit generating a first power supply potential,
wherein the plurality of memory cells are supplied with a second power supply potential,
wherein the first power supply potential is supplied to the driver circuit,
wherein the potential generation circuit generates the first power supply potential lower than the second power supply potential during a read operation of the plurality of memory cells, and
wherein the method further comprises:
pulling up the second portion of the word line by turning on the field effect transistor based on the potential level of the driven second wiring.

* * * * *